(12) United States Patent
Abousleman

(10) Patent No.: US 6,661,842 B1
(45) Date of Patent: Dec. 9, 2003

(54) METHODS AND APPARATUS FOR ERROR-RESILIENT VIDEO CODING

(75) Inventor: Glen Patrick Abousleman, Scottsdale, AZ (US)

(73) Assignee: General Dynamics Decision Systems, Inc., Scottsdale, AZ (US)

( * ) Notice: Subject to any disclaimer, the term of this patent is extended or adjusted under 35 U.S.C. 154(b) by 178 days.

(21) Appl. No.: 09/667,903

(22) Filed: Sep. 22, 2000

(51) Int. Cl.[7] .............................. H04N 7/12; G06K 9/36
(52) U.S. Cl. .............................. 375/240.11; 375/240.19; 382/281; 348/398.1
(58) Field of Search ..................... 375/240.11, 240.01, 375/240.16, 240.19, 240.21, 240.23; 382/233, 240, 244, 248; 348/398.1, 408.1, 699

(56) References Cited

U.S. PATENT DOCUMENTS

| | | | | |
|---|---|---|---|---|
| 6,128,346 A | * | 10/2000 | Suarez et al. | ............... 375/254 |
| 6,192,158 B1 | * | 2/2001 | Abousleman | ............... 382/240 |
| 6,195,465 B1 | * | 2/2001 | Zandi et al. | ................ 382/248 |
| 6,219,383 B1 | * | 4/2001 | Park | ...................... 375/240.16 |
| 6,298,163 B1 | * | 10/2001 | Sodogar et al. | ............. 382/240 |

* cited by examiner

Primary Examiner—Gims S. Philippe
(74) Attorney, Agent, or Firm—Jenner & Block, LLC

(57) ABSTRACT

Apparatus and methods are provided for encoding an input frame of a video sequence for transmission over a channel. The method and apparatus decompose the input frame into multiple subbands and divide the multiple subbands into multiple blocks corresponding to a region of the input frame. The blocks in the highest frequency subbands of the multiple blocks are selected based upon a luminance component of the input frame and the multiple blocks in the highest frequency subbands are classified into a multiple classes to provide a multiple class labels. The multiple class labels are collected to form a subband class map for each of the multiple blocks in the highest frequency subbands and a global class map is constructed from a majority evaluation of the subband map for each of the multiple blocks. The multiple blocks within the multiple subbands are grouped which have one of the class labels to form multiple subband class sequences.

20 Claims, 20 Drawing Sheets

TRANSITION PROBABILITY MATRIX (R = 5)

WHERE, $\bar{P}_b = 1 - P_b$

METHODS AND APPARATUS FOR ERROR-RESILIENT VIDEO CODING

FIELD OF THE INVENTION

The present invention generally relates to video coding, and more particularly to methods and apparatus for error-resilient video coding.

BACKGROUND OF THE INVENTION

Compression techniques in image and video coding have been developed with the assumption of a reliable and noise free transport. In current video coding standards (e.g., MPEG-1, MPEG-2, and H.263), a block-based motion estimation and compensation scheme has been adopted that is combined with Discrete Cosine Transform (DCT) coding of the motion prediction error. In order to maximize coding efficiency, motion information and the DCT coded motion prediction error are entropy coded using variable length codes. This results in a bit stream that is vulnerable to channel errors, and the quality of the reconstructed video may be substantially degraded unless redundant information or an error-correction method is applied to the bit stream.

Techniques have been introduced to mitigate the effects of channel errors, including traditional channel coding and signal recovery. For example, forward error correction, error control coding, automatic retransmission request, signal reconstruction and error concealment have been introduced to mitigate the effects of channel errors. (See, Y. Wang and Q. Zhu, "Error Control and Concealment for Video Communication: A Review," Proceedings of the IEEE, Vol. 812, May 1998, which is hereby incorporated by reference.) Although these error-correction techniques provide satisfactory minimization of the effects that channel noise has on coded data under most, but not necessarily all, operating circumstances, the techniques generally introduce complexity and delay in the image coding process and apparatus. Moreover, the addition of redundant information to the compressed video data typically reduces the compression efficiency.

Accordingly, methods and apparatus for video coding are desirable that enable the transmission of high quality compressed video over noisy channels having limited-bandwidth, without substantial reliance upon channel coding, entropy coding, or motion compensation. Furthermore, additional desirable features, advantages and applications of the present invention will become apparent from the subsequent detailed description of a preferred exemplary embodiment and the appended claims, taken in conjunction with the accompanying drawings.

BRIEF DESCRIPTION OF THE DRAWINGS

The present invention will hereinafter be described in conjunction with the following drawing figures, wherein like numerals denote like elements, and.

DETAILED DESCRIPTION OF A PREFERRED EXEMPLARY EMBODIMENT

The following detailed description of a preferred exemplary embodiment is merely exemplary in nature and is not intended to limit the invention or the application and uses of the invention.

Figure 1:
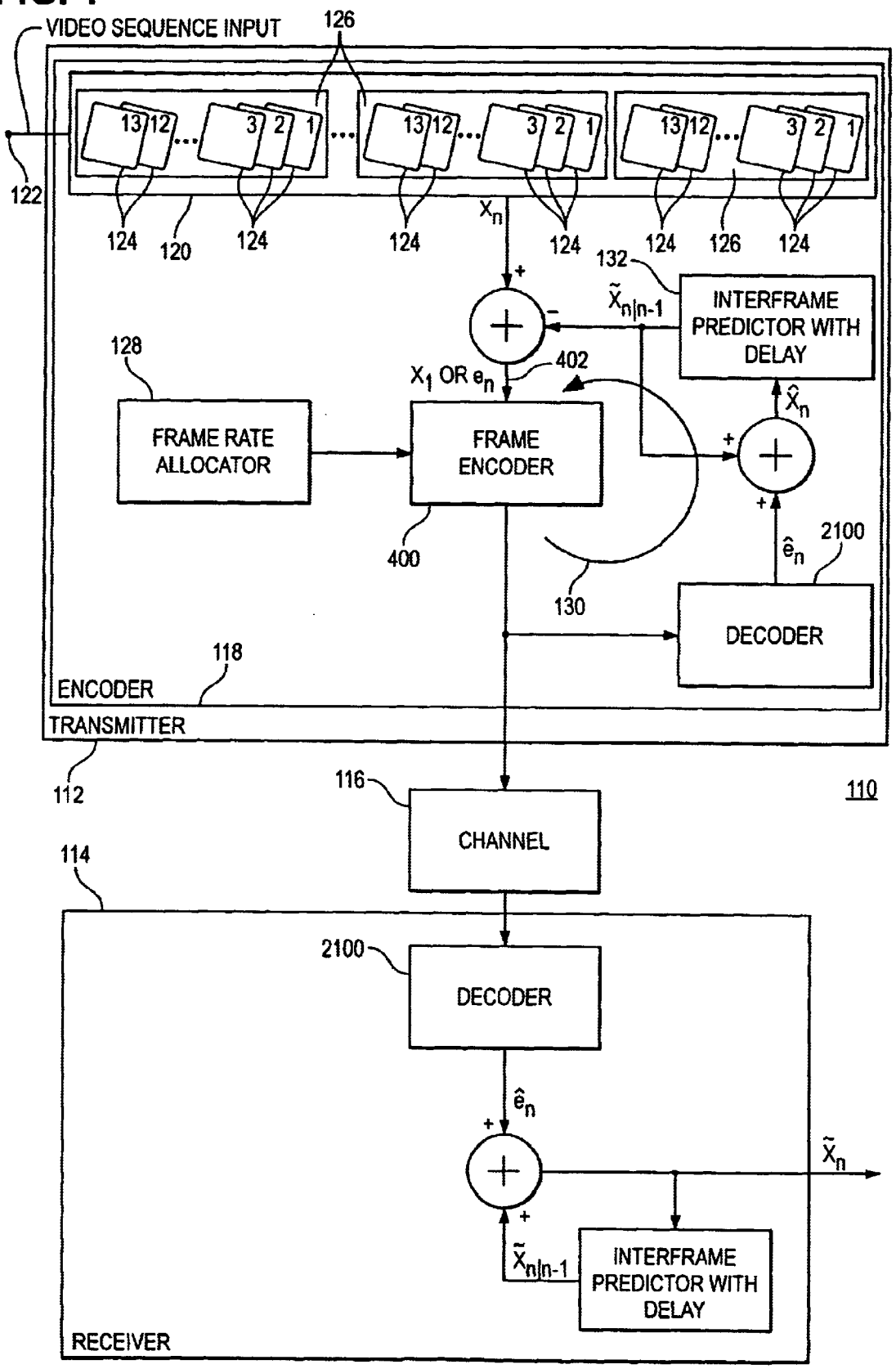
FIG. 1 is a communication system having an encoder according to a preferred exemplary embodiment of the present invention.

FIG. 1 illustrates a communication system 110, which implements error-resilient video coding in accordance with a preferred exemplary embodiment of the present invention. The communication system 110 includes, but is not limited to, a transmitter 112, a receiver 114 and a channel 116. The transmitter 112 transmits video data to the receiver 114 through the channel 116. The video data is produced by an encoder 118 of the transmitter 112 that substantially reduces or preferably eliminates channel coding, entropy coding and motion compensation.

The encoder 118 is configured to encode a video sequence 120 received at a video sequence input 122. The encoder 118 is configurable for any number of monochrome and color video sequences in any color and sampling format. For example, the encoder 118 may be configured to operate on RGB, YUV and YIQ video sequences with any type of sampling formats such as 4:4:4, 4:2:2 and 4:2:0.

The video sequence 120 received at the video sequence input 122 has multiple frames 124 that are grouped by the encoder 118 into multiple groups of pictures (GOP) 126. Each GOP 126 consists of a predetermined number of frames 124, and in a preferred embodiment, each GOP 126 consists of about thirteen (13) frames 124. However, each GOP 126 may consist of any number of frames greater than about thirteen or less than about thirteen. Furthermore, the video sequence 120 may also be grouped into each GOP 126 prior to receipt at the video sequence input 122.

The first frame or initial frame ($x_I$) of a GOP 126 is initially encoded by the frame encoder 400 and transmitted by the transmitter 112 as an initial condition for differential pulse code modulation (DPCM) at an initial rate ($R_1$) that is selected by a frame rate allocator 128. The initial frame ($x_I$) encoded by the frame encoder 400 is also provided to a DPCM loop 130 that includes a decoder 2100, which is configured to decode the initial frame and error frames encoded by the frame encoder 400 as subsequently described in this detailed description with reference to FIG. 21. The DPCM Loop 130 also includes an interframe predictor 132, which operates on substantially all of the pixels of the decoded initial frame ($\hat{x}_I$) and substantially all of the pixels of each subsequent decoded frame ($\hat{x}_n$) to produce a corresponding error frame ($e_n$). More specifically, an estimate ($\tilde{x}_{n/n-1}$) of a frame ($x_n$) in the video sequence 120 is obtained from a decided version of a previous frame ($\hat{x}_{n-1}$) and the error frame ($e_n$) is formed from the difference of the frame ($x_n$) and the estimate ($\tilde{x}_{n/n-1}$) (i.e., $e_n = x_n - \tilde{x}_{n/n-1}$). In one preferred embodiment of the present invention, the estimate ($\tilde{x}_{n/n-1}$) is found with a single-pixel configuration of the interframe predictor 132, and in a second preferred embodiment of the present invention, the estimate ($\tilde{x}_{n/n-1}$) is found with a multi-pixel configuration of the interframe predictor 132.

Figure 2:
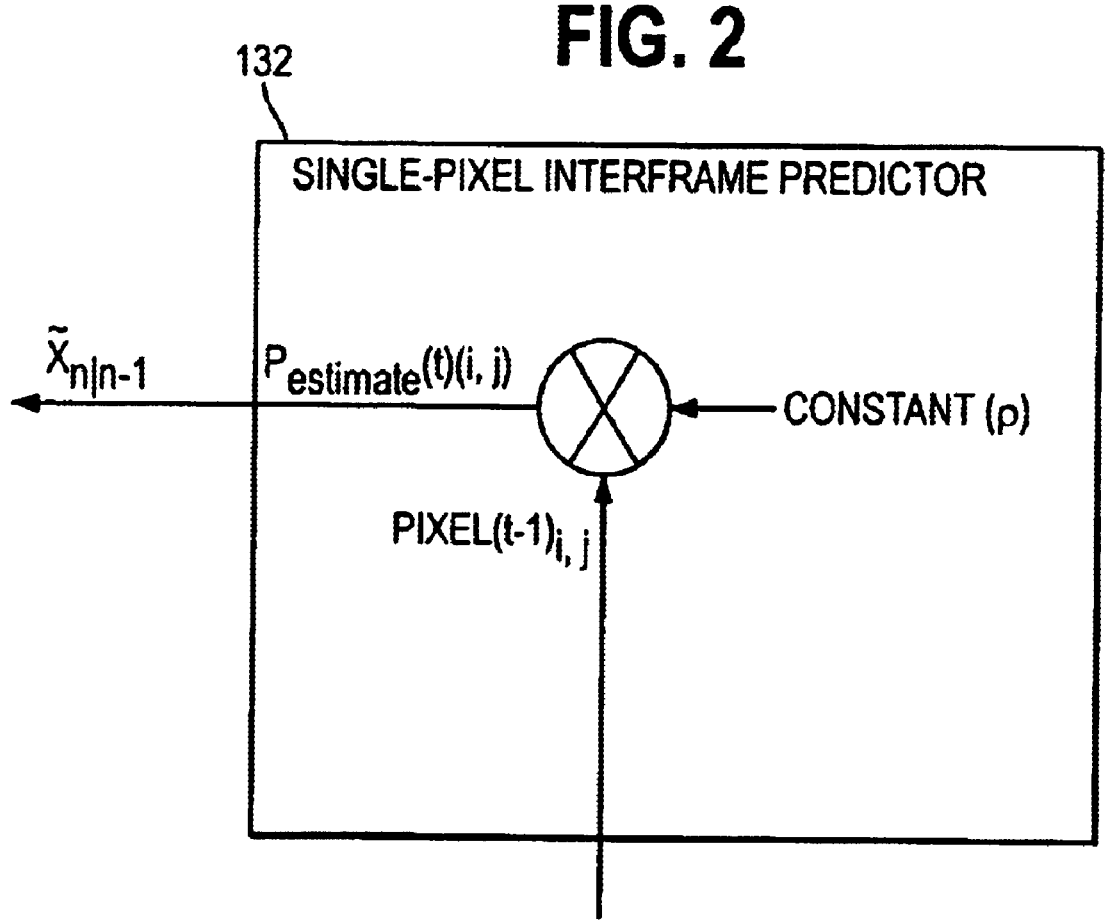
FIG. 2 is the single-pixel configuration of the interframe predictor of FIG. 1 according to a preferred exemplary embodiment of the present invention.

Referring to FIG. 2, the single-pixel configuration of the interframe predictor 132 is shown according to a preferred exemplary embodiment of the present invention. The single-pixel configuration of the interframe predictor 132 is a first-order linear predictor with a temporal correlation coefficient (ρ) for any pixel in the video frame. The single-pixel configuration of the interframe predictor 132 receives a pixel from the previously decoded frame (pixel $_{(t-1)\ (i,\ j)}$), which is multiplied by the temporal correlation coefficient (ρ) to produce a corresponding pixel estimate (pixel$_{estimate(t)(i,\ j)}$) for the frame estimate ($\tilde{x}_{n/n-1}$). The correlation coefficient (ρ) is preferably selected according to temporal video statistics, and a correlation coefficient (ρ) of about 0.95 has been found to provide satisfactory results, even though any value may be used for the correlation coefficient (ρ). While this single-pixel configuration of the interframe predictor 132 adequately produces pixel estimates for the frame estimate ($\tilde{x}_{n/n-1}$), the pixel estimates of the single-pixel configuration of the interframe predictor 132 are susceptible to bit corruption errors.

Figure 3:
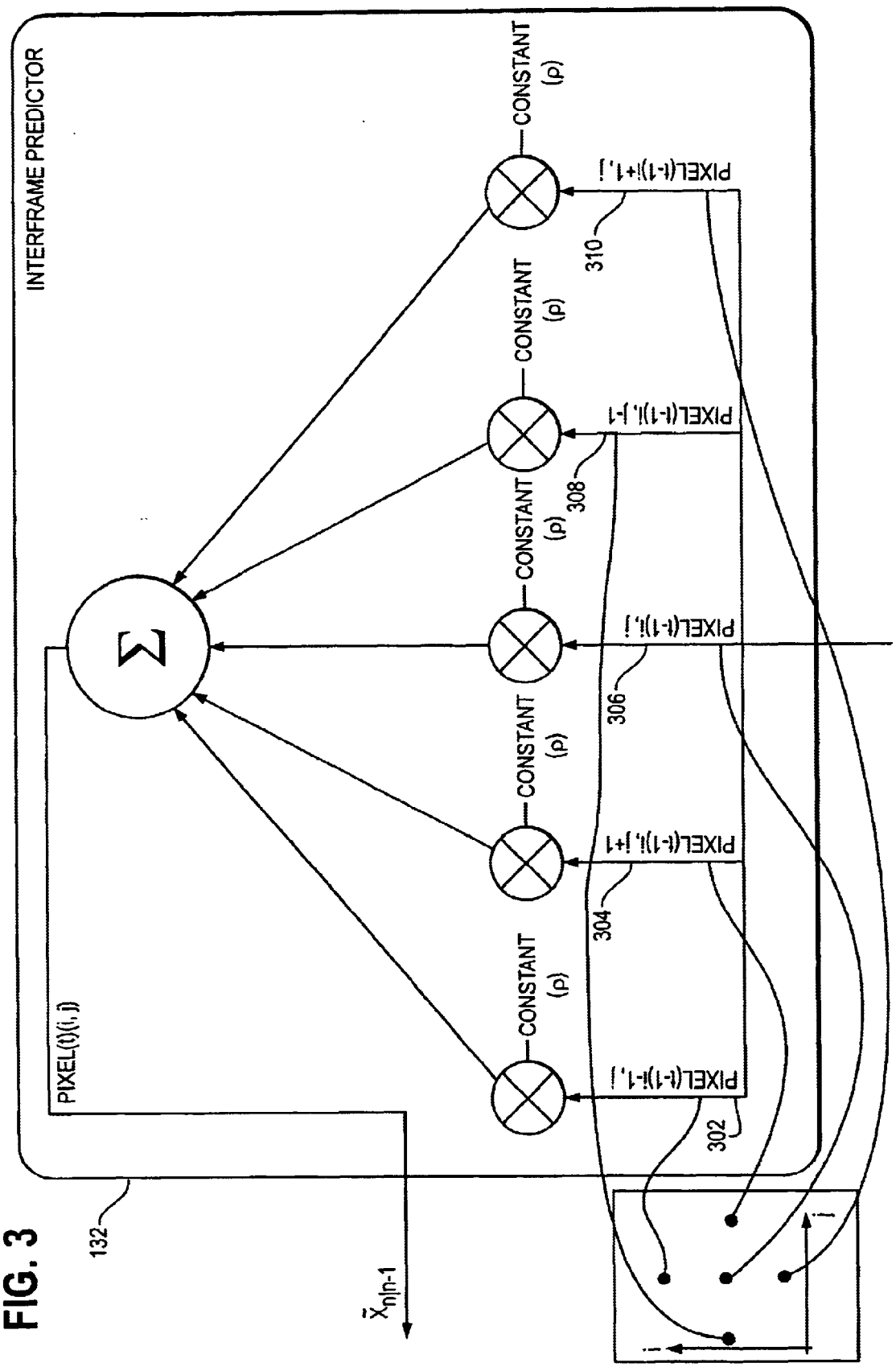
FIG. 3 is the multi-pixel configuration of the interframe predictor of FIG. 1 according to a preferred exemplary embodiment of the present invention.

Referring to FIG. 3, the multi-pixel configuration of the interframe predictor 132 is shown according to an alternate preferred embodiment of the present invention, which reduces the effect of bit corruption errors. The multi-pixel configuration of the interframe predictor 132 obtains a pixel estimate for the frame estimate ($\tilde{x}_{n/n-1}$) from a weighted combination of a group of pixels from the previous decoded frame. For example, the multi-pixel configuration of the interframe predictor 132 may be configured to receive multiple pixels (302, 304, 306, 308, 310) from the previously decoded frame (pixel$_{(t-1)\ (i,j)}$), which are each multiplied by the previously discussed temporal correlation coefficient (ρ), and summed to produce a corresponding pixel estimate (pixel$_{estimate\ (t)\ (i,\ j)}$) for the frame estimate ($\tilde{x}_{n/n-1}$). This provides a frame estimate from estimated pixels that do not depend upon a single value, but depend upon the surrounding pixels as well. The multi-pixel configuration of the interframe predictor 132 may be configured to use more than five or less than five pixels, and may also be configured to use pixels from a time period other than the immediately preceding interval (i.e., t−1, t−2, t−3, . . . t−n). Once the difference is obtained between the frame ($\tilde{x}_n$) and the estimate ($\tilde{x}_{n/n-1}$) generated by the multi-pixel configuration of the interframe predictor 132 or the single-pixel configuration of the interframe predictor 132 (FIG. 2), a spatially correlated error frame ($e_n$) is available for quantization.

Figure 4:
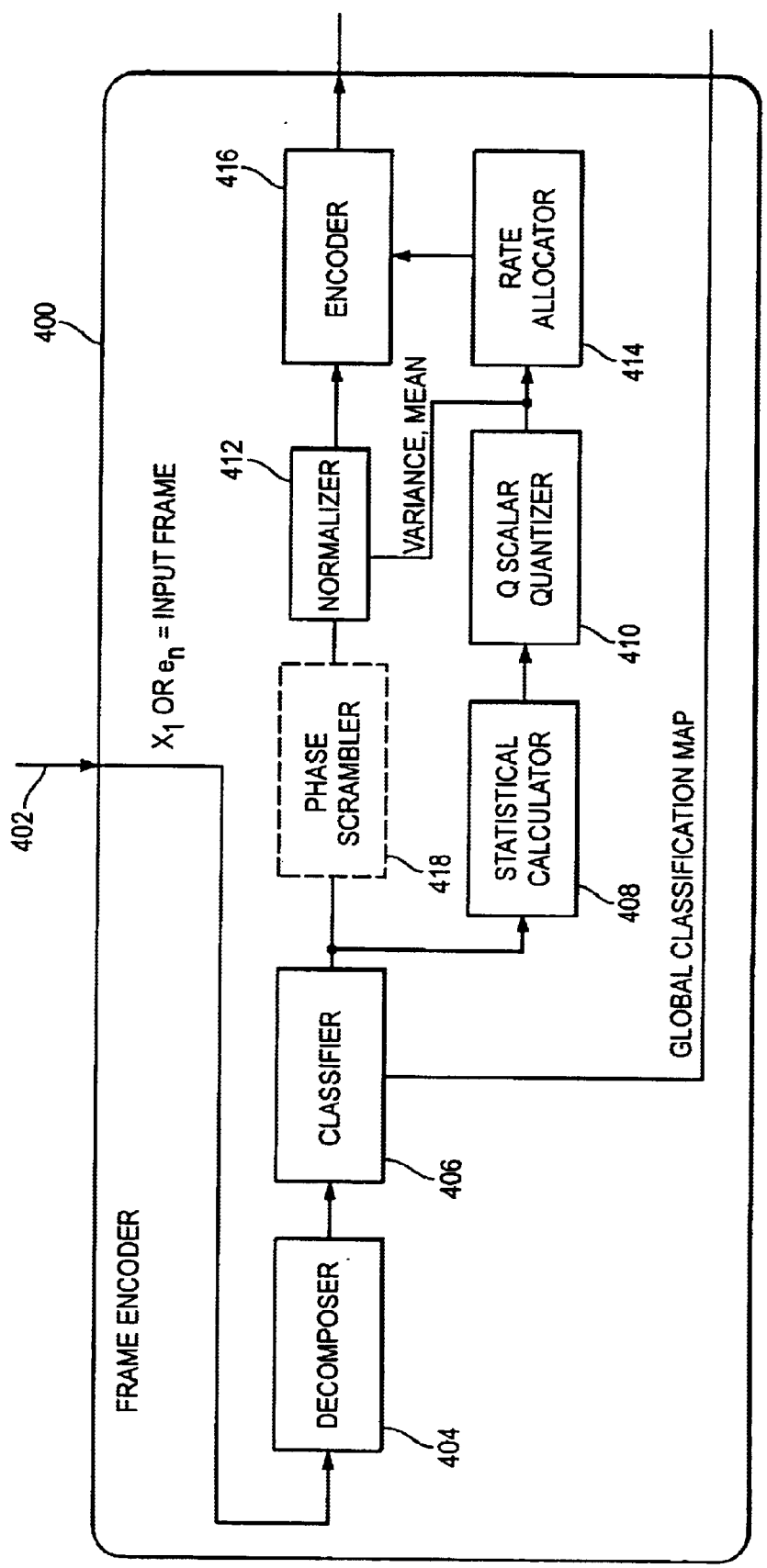
FIG. 4 is the frame encoder of FIG. 1 according to a preferred exemplary embodiment of the present invention.
Figure 5:
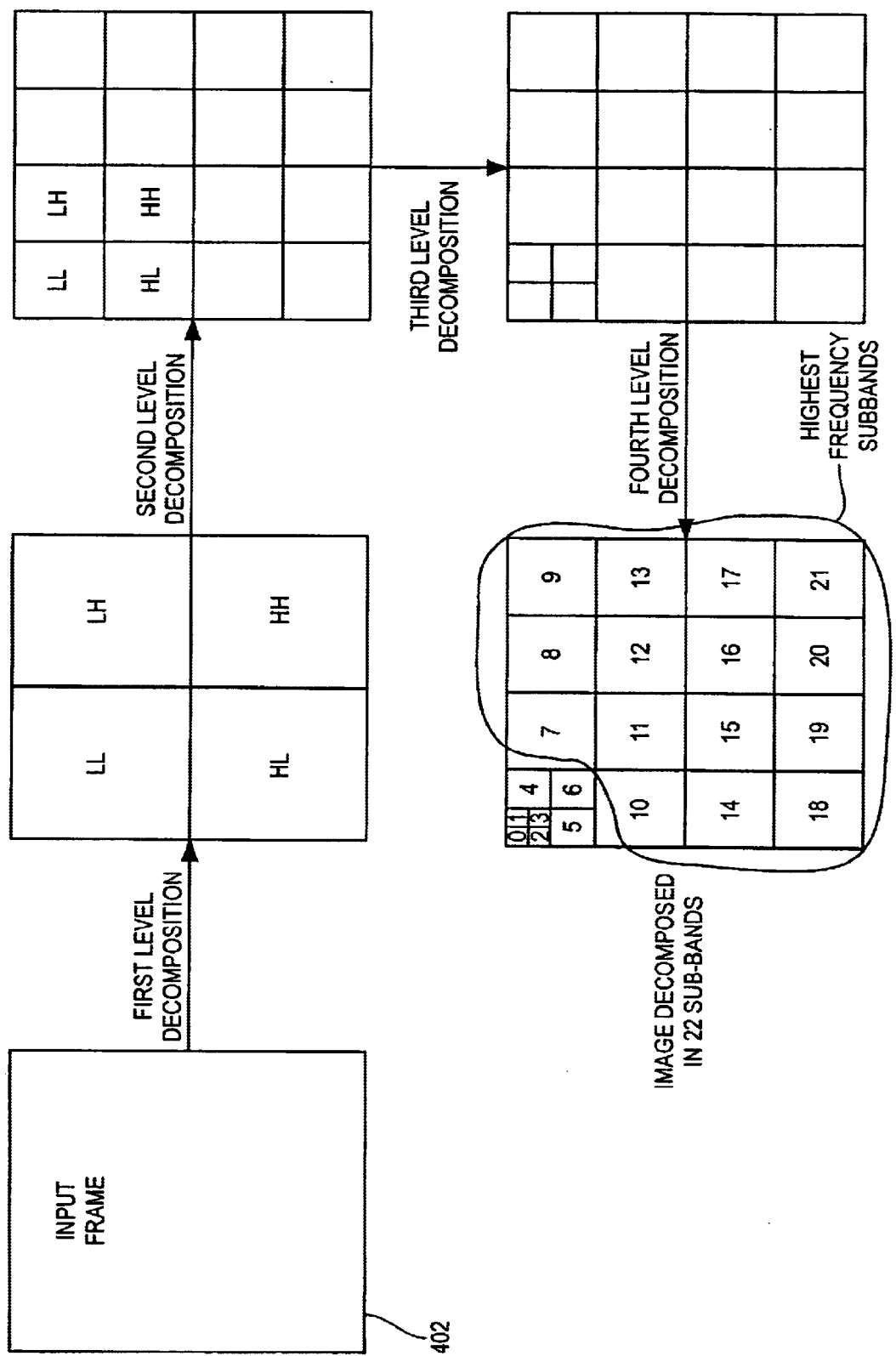
FIG. 5 is an example of a decomposition of an input frame as performed by the decomposer of FIG. 4 according to a preferred exemplary embodiment of the present invention.

Referring to FIG. 4, the frame encoder 400 of FIG. 1 is shown in greater detail. The frame encoder 400 receives the initial frame ($x_1$) and each subsequent error frame ($e_n$) of a GOP 126 (FIG. 1) as an input frame 402 and decomposes each component of the input frame 402 into multiple discrete subbands with a decomposer 404. The decomposer 404 can utilize any number of transformation techniques, such as wavelet decomposition, Fourier transformation or discrete cosine transformation, for example. In a preferred embodiment, the decomposer 404 uses a two-dimensional (2-D) discrete wavelet transform (DWT) to perform a four level decomposition of each component of the input frame 402 into about twenty-two discrete subbands using a modified Mallat tree configuration, as illustrated in FIG. 5. Therefore, an input frame having three components (e.g., Y, U, V) would be decomposed into sixty-six discrete subbands.

Figure 6:
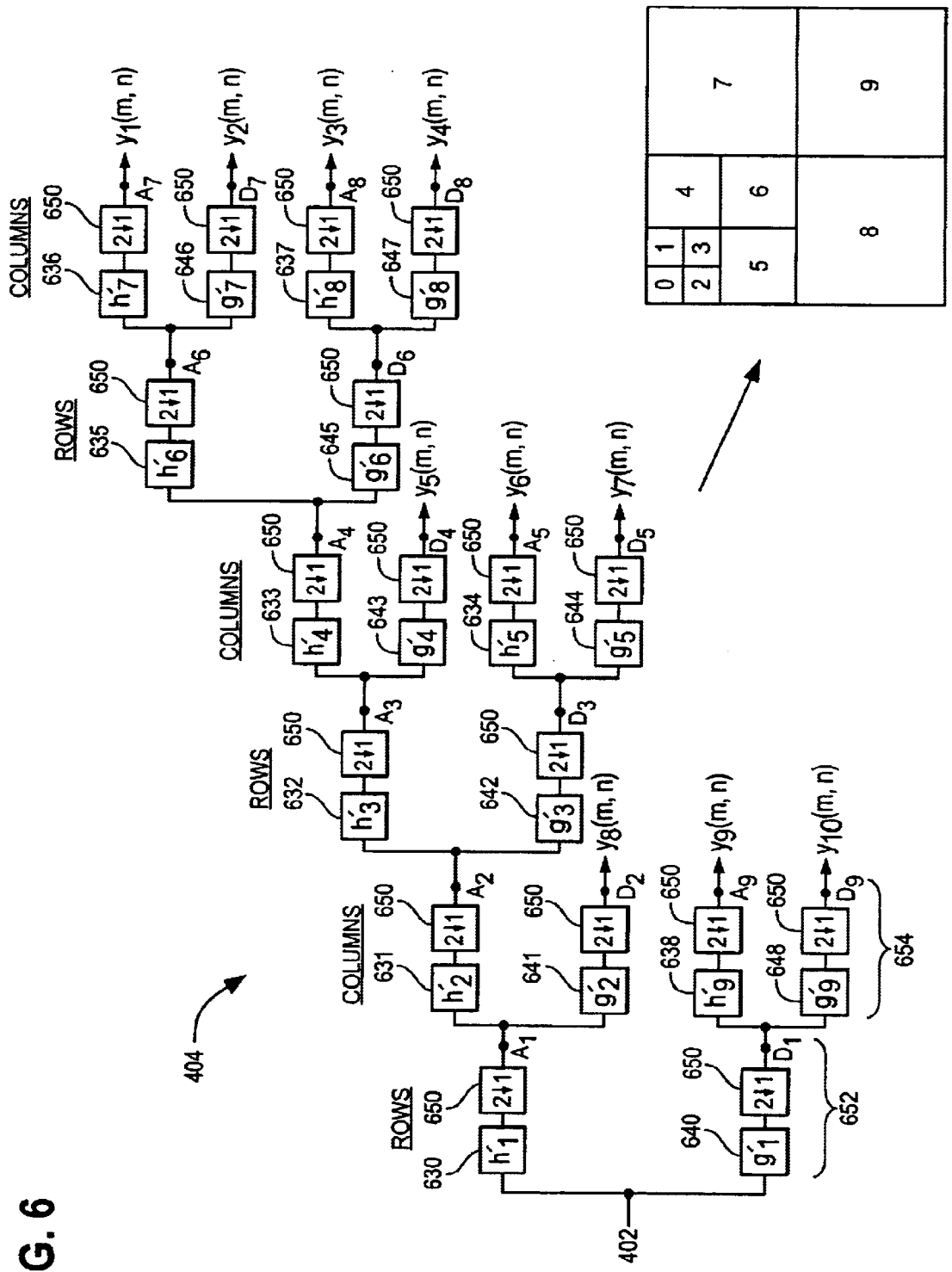
FIG. 6 is the decomposer of FIG. 4 according to a preferred exemplary embodiment of the present invention.

Referring to FIG. 6, the decomposer 404 is shown and configured to perform a 2-D DWT decomposition of any component of the input frame 402 into about ten discrete subbands according to a preferred exemplary embodiment. While the decomposer 404 of FIG. 6 is configured to perform a decomposition of any component of the input frame 402 into ten discrete subbands, the decomposer 404 can be configured for any number of subbands, including the twenty-two discrete subbands. The decomposer 404 includes a plurality of low pass filters 630–638 and a plurality of high pass filters 640–648 for performing spectral decomposition of the input frame 402. In a preferred exemplary embodiment, the low and high pass filters are implemented as finite impulse response (FIR) filters. The input frame 402 is decomposed into the multiple discrete subbands for eventual classification, mapping and quantization. The decomposer 404 also includes a plurality of down samplers 650 for reducing the overall number of samples describing the contents of each discrete subband. In a preferred embodiment, 2-to-1 down samplers 650 are used to remove and discard alternating bits from the sequence output by each high-pass and low-pass filter, and the down sampling ratio used will be application specific. The decomposer 404 produces one 2-D signal for each of the discrete subbands (i.e., $y_0(m,n)$–$y_s(m,n)$, where S is the number of subbands).

Each stage of the decomposer 404 divides the input frame 402 into a course approximation signal ($A_m$) and a detail signal ($D_m$). The course approximation signal ($A_m$) and the detail signal ($D_m$) can then be further divided into further approximation and detail signals (e.g., $A_{m+1}$ and $D_{m+1}$). This filtering scheme facilitates the performance of row/column splitting. A row/column split effectively filters the input frame 402 of dimension M rows by N columns along the rows and columns to produce four subbands, each of dimension M/2 rows by N/2 columns.

More specifically, in the first stage 652 of the decomposer 404, each row of length N of the input frame 402 is convolved with the impulse response ($h_1'$) of the first low pass filter 630 to produce a first filtered output sequence which is also of length N. The first filtered output sequence is then decimated by a factor of two in the corresponding 2-to-1 down sampler 650 to produce a first decimated output sequence of length N/2. Also in the first stage 652 of the decomposer 404, each row of length N of the input frame 402 is convolved with the impulse response ($g_1'$) of the first high pass filter 640 to produce a second filtered output sequence of length N. The second filtered output sequence is decimated in the corresponding 2-to-1 down sampler 650 to produce a second decimated output sequence of length N/2. The first decimated output sequence for the rows of the input image 402 are collected into a new first 2-D signal ($A_1$) of dimensional M rows by N/2 columns. Similarly, the second decimated output sequences for the rows of the input image 402 are collected into a new second 2-D signal ($D_1$) of dimension M rows by N/2 columns.

In the second stage 654 of the decomposer 404, each column of the first new 2-D signal ($A_1$) is convolved with the impulse response ($h_2'$) of low pass filter 631 to produce a third filtered output sequence of length M. The sequence is decimated in the corresponding 2-to-1 down sampler 650 to create a third decimated output sequence of length M/2. In the second stage 654, each column of the first new 2-D signal ($A_1$) is convolved with the impulse response ($g_2'$) of high pass filter 641 to create a fourth filtered output sequence of length M. The fourth filtered output sequence is then decimated to produce a fourth decimated output sequence of length M/2. The third decimated output sequence for all of the columns of the first new 2-D signal ($A_1$) are then collected into a third new 2-D signal ($A_2$) of dimension M/2 rows by N/2 columns. Similarly, the fourth decimated output sequence for all of the columns of the first new 2-D signal ($A_1$) are collected into a fourth new 2-D signal ($D_2$) of dimension M/2 rows by N/2 columns. A similar procedure is then performed to signal ($D_1$) to complete the row/column split. Additional row/column splits can then be performed to further divide the input frame 402 into the desired number of discrete subbands (i.e., $y_1(m, n)$–$y_s(m,n)$), which are preferably partitioned into regions.

The region size within each discrete subband is also preferably adjusted to correspond to a predetermined number of pixel regions in the input frame. For example, the coefficients of each discrete subband can be partitioned into block shaped regions, and each block size within each subband can be adjusted so as to correspond to dimensioned pixel blocks (e.g., 16×16 pixel blocks) in the input frame 402. Once the coefficient of each discrete subband is partitioned into the regions (e.g., block shaped regions) and adjusted to correspond to the dimensioned pixel blocks in the input frame 402, one or more blocks within each subband are provided for classification into one of multiple classes based upon the luminance component (Y) of the input frame 402.

Referring to FIG. 4, the classifier 406 is operatively configured to receive the one or more blocks within each subband, classify these blocks into one of the multiple classes, and generate a single global classification map and numerous subband class sequences from the input frame 402. While any number of classification methods can be implemented by the classifier 406 to classify the blocks within each subband based upon the luminance component (Y) of the input frame 402, and generate a single global classification map and subband class sequence from the input frame 402, FIGS. 7, 8, 9 and 10 provide preferred exemplary methods that can be implemented by the classifier 406.

Figure 7:
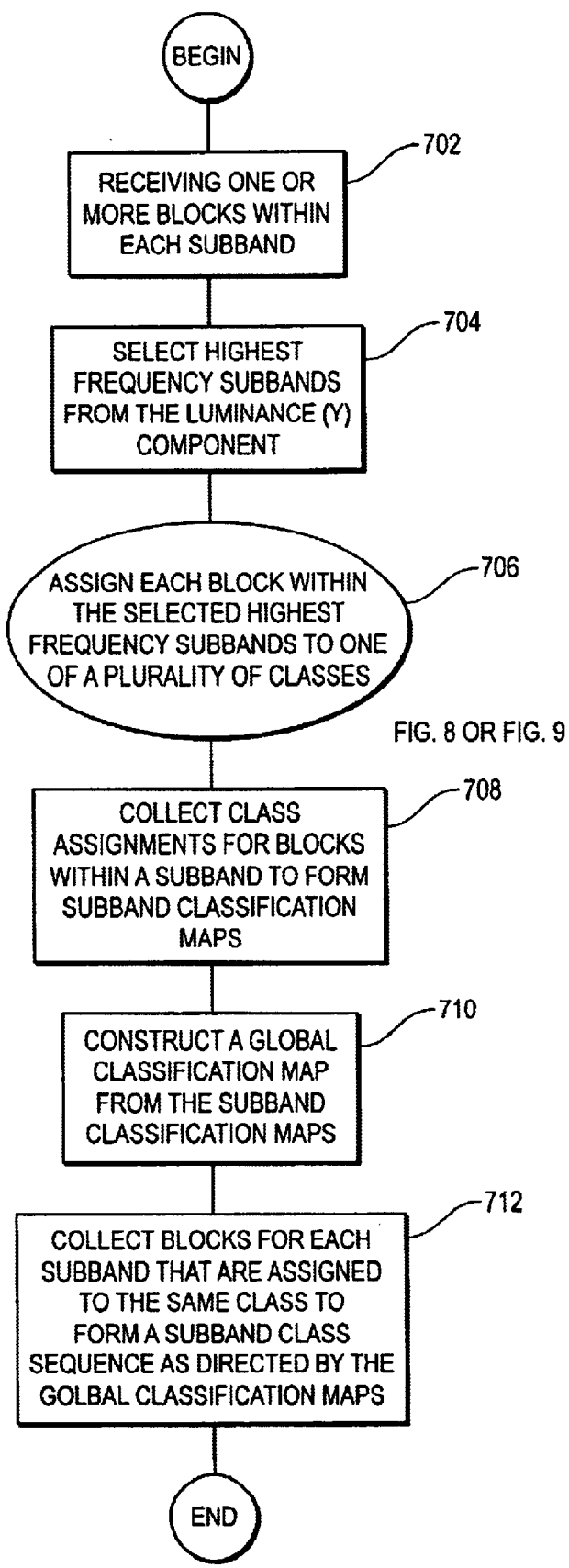
FIG. 7 is a method implemented by the classifier of FIG. 4 according to a preferred exemplary embodiment of the present invention.

Referring to FIG. 7, one or more blocks within each subband are received by the classifier 702, and the blocks in each of the highest-frequency subbands are selected from the luminance component (Y) of the input frame decomposed by the decomposer 704. For example, the seventh through twenty-first subbands are selected for the twenty-two-subband decomposition of the input frame 402 as shown in FIG. 5. For each of the selected highest-frequency subbands, each block within each subband is assigned to one of a plurality of classes (i.e., J classes, where J is greater than one) 706 by either the exemplary method shown in FIG. 8 or the exemplary method shown in FIG. 9, although any number of methods may be used to assign each block within each subband to one of the J classes. The assignment of each block within each subband to one of the J classes is collected to form a subband classification map 708. More specifically, the assignment of a block to one of the J classes 702 provides a class label for each block, and the collection of labels for substantially all and preferably all blocks within a given subband is referred to herein as a subband classification map. Therefore, if a given subband has W blocks of coefficients, there would be W entries in the subband classification map for the subband under consideration, with each entry providing the class label for each corresponding block. Once all blocks within the selected highest-frequency subbands have been classified into one of the J classes, and individual subband classification maps have been constructed, a single global classification map is constructed from the individual subband classification maps 710.

The single global classification map is constructed from the individual classification maps using a majority evaluation of each of the corresponding entries in the individual classification maps, with the class label that appears most often being assigned to the global classification map. In other words, for the elements corresponding to the same location within each classification map, the class assignment label that appears most frequently is the class assignment that is chosen for the global classification map. Once the global classification map has been constructed from the subband classification maps of the highest-frequency subbands, the global classification map is used to label substantially all blocks of substantially all subbands and preferably all blocks of all subbands to be encoded for transmission. Once the blocks of the subbands have been classified into one of the J classes as specified by the global classification map, the coefficients within each block must be appropriately collected for further processing. More specifically, blocks within each subband that are assigned to the same class are grouped together to form subband-class sequences 712.

Figure 8:
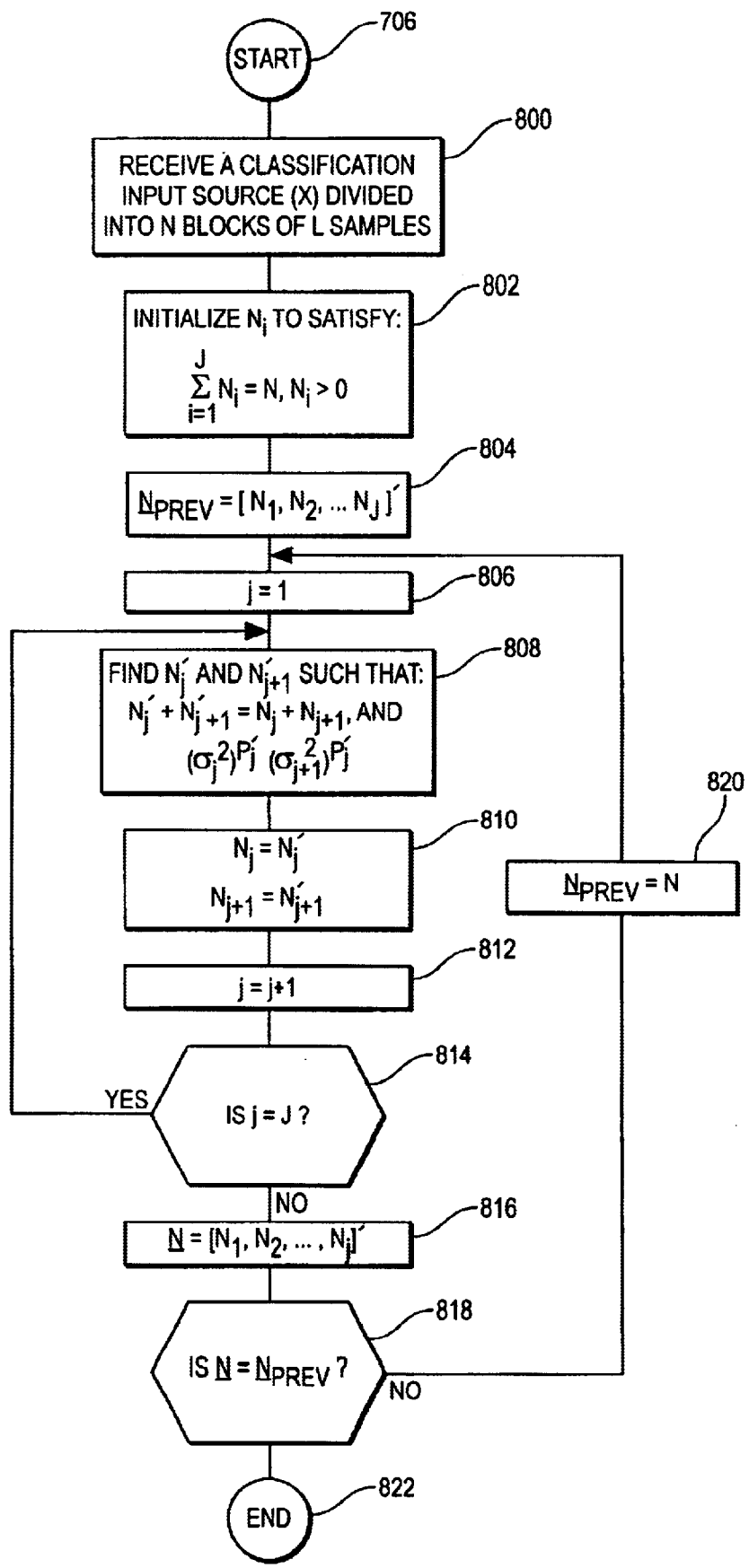
FIG. 8 is a method for classifying the blocks in each of the highest frequency subbands into classes according to a preferred exemplary embodiment of the present invention.

Referring to FIG. 8, a first exemplary embodiment is illustrated for classifying the blocks in each of the highest frequent subbands into one of multiple classes 706. This first exemplary method shown in FIG. 8 is a pairwise maximization of coding gain and a variation of a subband classification method presented by R. L. Joshi, T. R. Fischer, and R. H. Bamberger in "Optimum Classification in Subband Coding of Images," Proc. International Conference of Image Processing, pages 883–887, November 1994, which is hereby incorporated by reference. While the following method of FIG. 8 and alternate method of FIG. 9 will be described for a classification region within each subband that is adjusted to correspond to sixteen-by-sixteen (i.e., 16×16) pixel blocks in the input frame, it should be understood the present invention is not limited to this classification region size and shape, and any number of sizes and shapes for the classification region may be selected in accordance with the present invention.

The classification method 706 begins by receiving a classification input source (X) divided into N blocks of L consecutive samples 800, with each of the N blocks to be classified into one of multiple classes (i.e., one of J classes) to create multiple classification output sources. Note that for the DWT decomposition illustrated in FIG. 5, the seventh through twenty-first subbands will have 4×4 block sizes, which corresponds to a 16×16 block size in the input frame. Also note that the classification input source (X) corresponds to a luminance (Y) subband.

The samples from each of the N blocks are assigned to one of multiple classes (i.e., one of i classes) and grouped into a classification output source ($X_i$), where i is greater than or equal to one and less than or equal to J (i.e., $1 \leq i \leq J$). Each classification output source ($X_i$) is assigned a total number of blocks ($N_i$), has a variance ($\sigma_i^2$), and a probability ($p_i$) that a sample belongs to the classification output source ($X_i$)(i.,e., $p_i = N_i/N$, $1 \leq i \leq J$).

The classification method 706 continues with the initialization of each $N_i$ 802 (i.e., $N_1, N_2, N_3, \ldots, N_J$) as follows:

$$\sum_{i=1}^{J} N_i = N \tag{1}$$

Where $N_i > 0$. The results of the initialization are then formed into a vector 804 as follows:

$$\underline{N}_{prev} = [N_1, N_2, \ldots, N_J]^t. \tag{2}$$

An index (j) is initialized 806, and the values for $N'_j$ and $N'_{j+1}$ are identified such that $N'_j + N'_{j+1} = N_j + N_{j+1}$ and $(\sigma_j^2)^{p'j} (\sigma_{j+1}^2)^{p'j}$ is minimized 808.

After the values for $N'_j$ and $N'_{j+1}$ are identified 808, the original values $N_j$ and $N_{j+1}$ are replaced with these values 810, the index (j) is incremented 812, and compared to J 814. If the index (j) is less than J, the values for $N'_j$ and $N'_{j+1}$ are identified such that $N'_j + N'+1 = N_j + N_{j+1}$ and $(\sigma_j^2)^{p'j} (\sigma_{j+1}^2)^{p'j}$ is minimized 808 with the incremented index (j). If the index (j) is not less than J, then a new vector ($\underline{N}$) is formed 816 as follows:

$$\underline{N} = [N_1, N_2, \ldots, N_J]^t \tag{3}$$

The new vector (N) is compared to the previous vector ($\underline{N}_{prev}$) 818 and, if the new vector ($\underline{N}$) is equal to the previous vector ($\underline{N}_{prev}$), the classification method 706 is ended 822. If the new vector ($\underline{N}$) is not equal to the previous vector ($\underline{N}_{prev}$), the new vector ($\underline{N}$) is designated as the previous vector ($\underline{N}_{prev}$) 824 (i.e., $\underline{N} = \underline{N}_{prev}$), and the classification method 706 returns to initialize the index (j) 806. The classification method 706 is repeated for substantially all and preferably all the values of the index (j). After the classification method has ended 822, the samples from each of the N blocks are assigned to one of a number (i) of classes and grouped into a classification output source ($X_i$).

Figure 9:
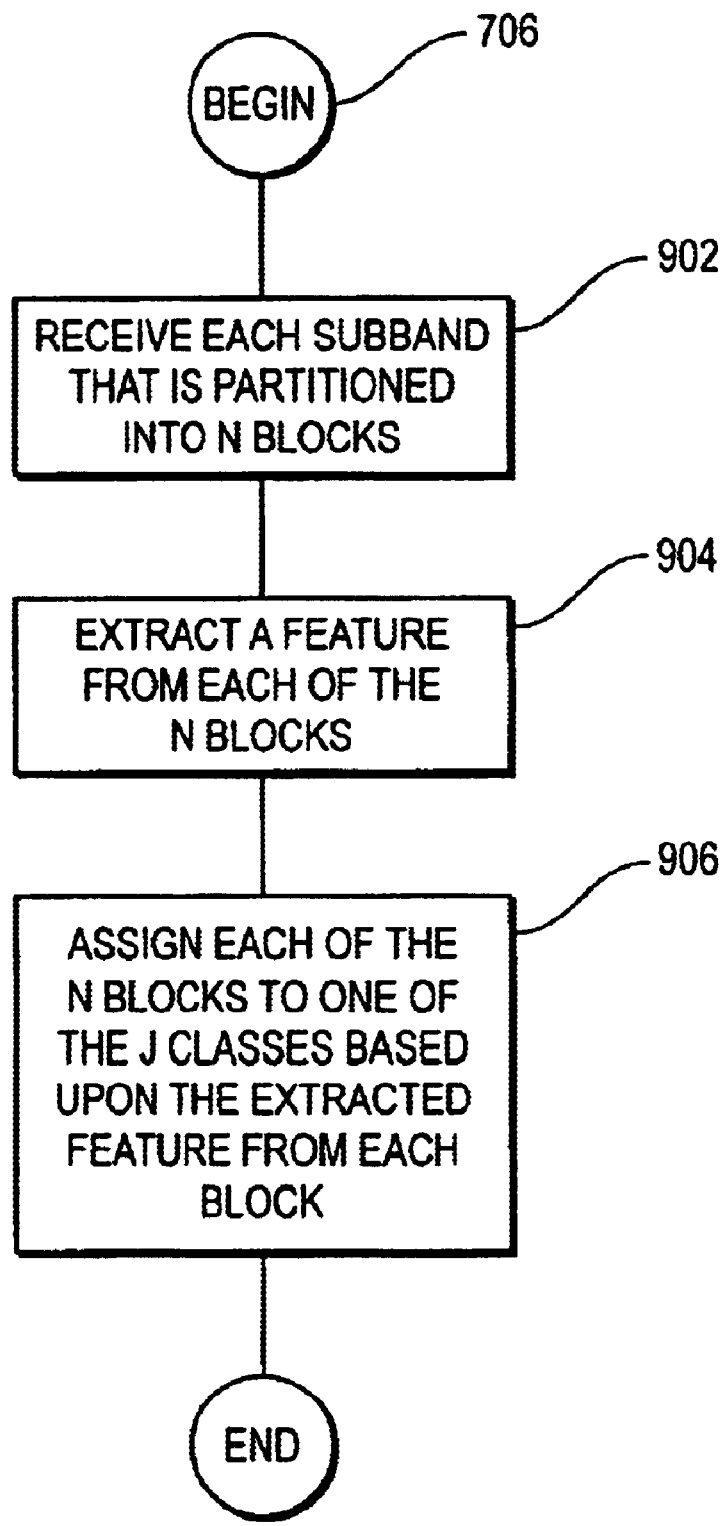
FIG. 9 is an alternate method for classifying the blocks in each of the highest frequency subbands according to a preferred exemplary embodiment of the present invention.

Referring to FIG. 9, an alternate exemplary embodiment is illustrated for classifying the blocks in each of the highest frequent subbands into one of multiple classes 706 of FIG. 7. As discussed with reference to FIG. 8, an assumption is made that each subband is partitioned into N blocks corresponding to 16×16 pixel blocks of the input frame. Therefore, the classification method 706 of FIG. 9 receives each subband that is partitioned into N blocks 902. Features are extracted from each block 904 and each of the N blocks is assigned to one of the J classes based upon the extracted feature 906.

More specifically, the method of FIG. 9 is preferably developed using an unsupervised K-means training algorithm. The feature extraction process is relevant to the performance and complexity of the classifier. In this detailed description of a preferred exemplary embodiment, the two features that are considered are the variance and edge density features, even though any number of features may be utilized in accordance with the invention. The variance feature is the variance of a block of coefficients and the edge density feature measures the number of edge pixels in a block.

For a K×K block with L total samples, the variance is calculated as:

$$\sigma_i = \frac{1}{L-1} \sum_{j=1}^{L} (x[j] - \mu)^2 \tag{4}$$

Where $$\mu = \frac{1}{L} \sum_{j=1}^{L} x[j] \tag{5}$$

For the edge density, a 2×2 Roberts gradient operator is preferably applied in two orthogonal directions to each block, even though other operators can also be used such as Sobel and Prewitt operators, for example. The magnitude of the sum of the two orthogonal components for each pixel is compared to a threshold. All coefficients having magnitudes exceeding the threshold are declared "edge" pixels. The edge density is normalized between zero and one.

To classify a block into a particular class, class exemplars or centroids are created with a training procedure. The result of the training procedure is a set of centroids representing the J classes. The actual classifier assigns a class label representing the closest centroid to each block. Classification entails computing a q-dimensional Euclidean distance with the J classes, and selecting the smallest value for each block, where q is the number of features. This produces a classification map for each subband. The class centroids are preferably computed using K-means clustering. Given a desired number of clusters and their dimension, the method initializes random cluster centroids. The set of extracted features from each block of a set of training blocks is presented for clustering. Each block is assigned to the closest cluster centroid, where distance is measured in Euclidean distance.

After the first presentation of the training data, the cluster centroids are recomputed by averaging feature vectors in each cluster. The training data is presented, classified, and the cluster-centroids recomputed until the method converges. The classifier-training method makes use of a set of training images, a feature extraction scheme, and a clustering method. The training images or subbands are partitioned into blocks such that each region corresponds to pixel block dimensions of the input frame (i.e., 16×16 pixel blocks), which are provided to the feature extractor. The considered feature is computed for each block and input for K-means clustering with the J classes. The output of the training method is (J)(N) one-dimensional centroids representing the classes, where N is the number of subbands and N=1 corresponds to the input frame, with no decomposition. The variance and edge density features can either be used individually or in tandem for classification.

Figure 10:
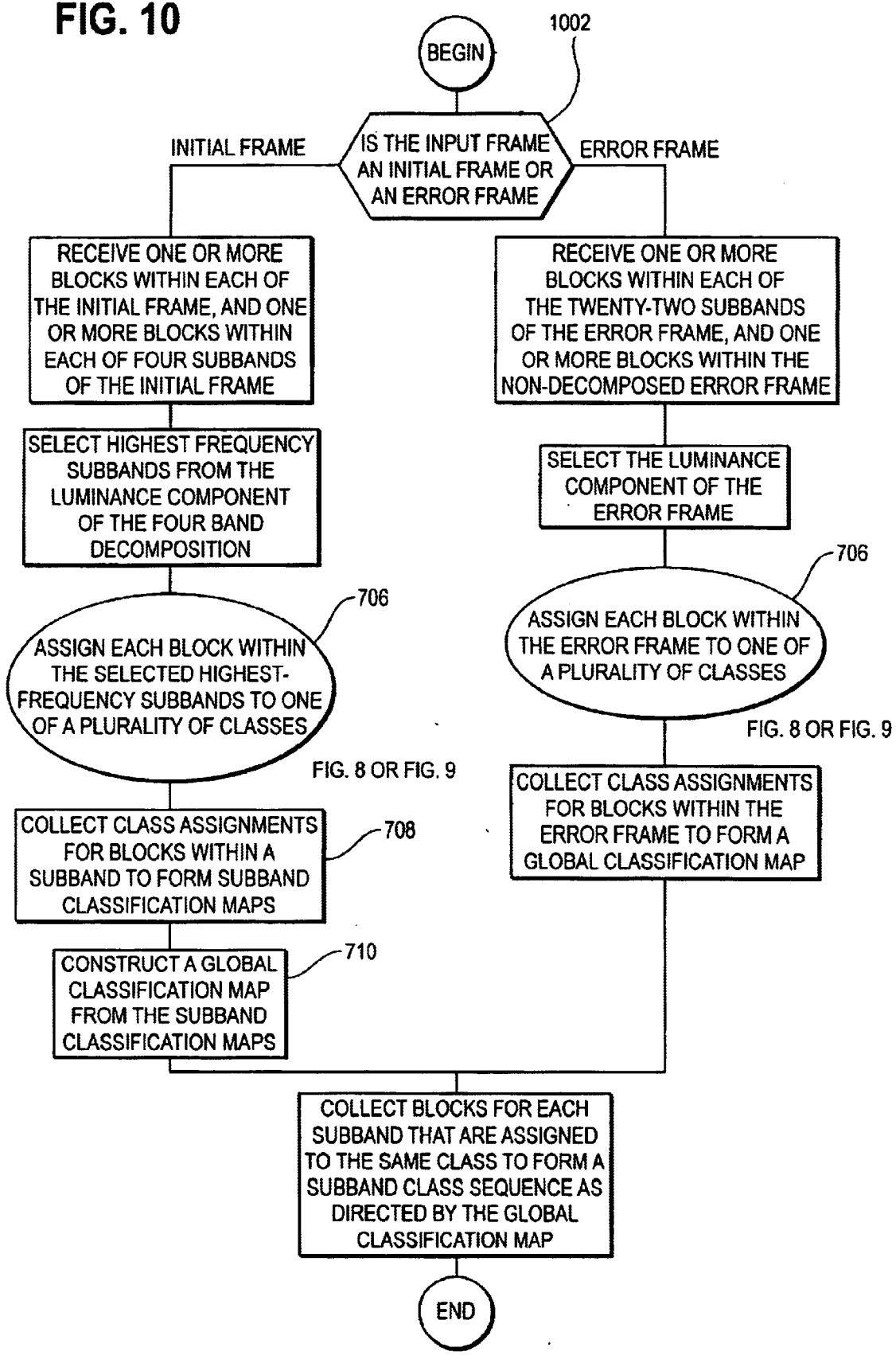
FIG. 10 is an alternate method implemented by the classifier of FIG. 4 according to a preferred exemplary embodiment of the present invention.
Figure 11:
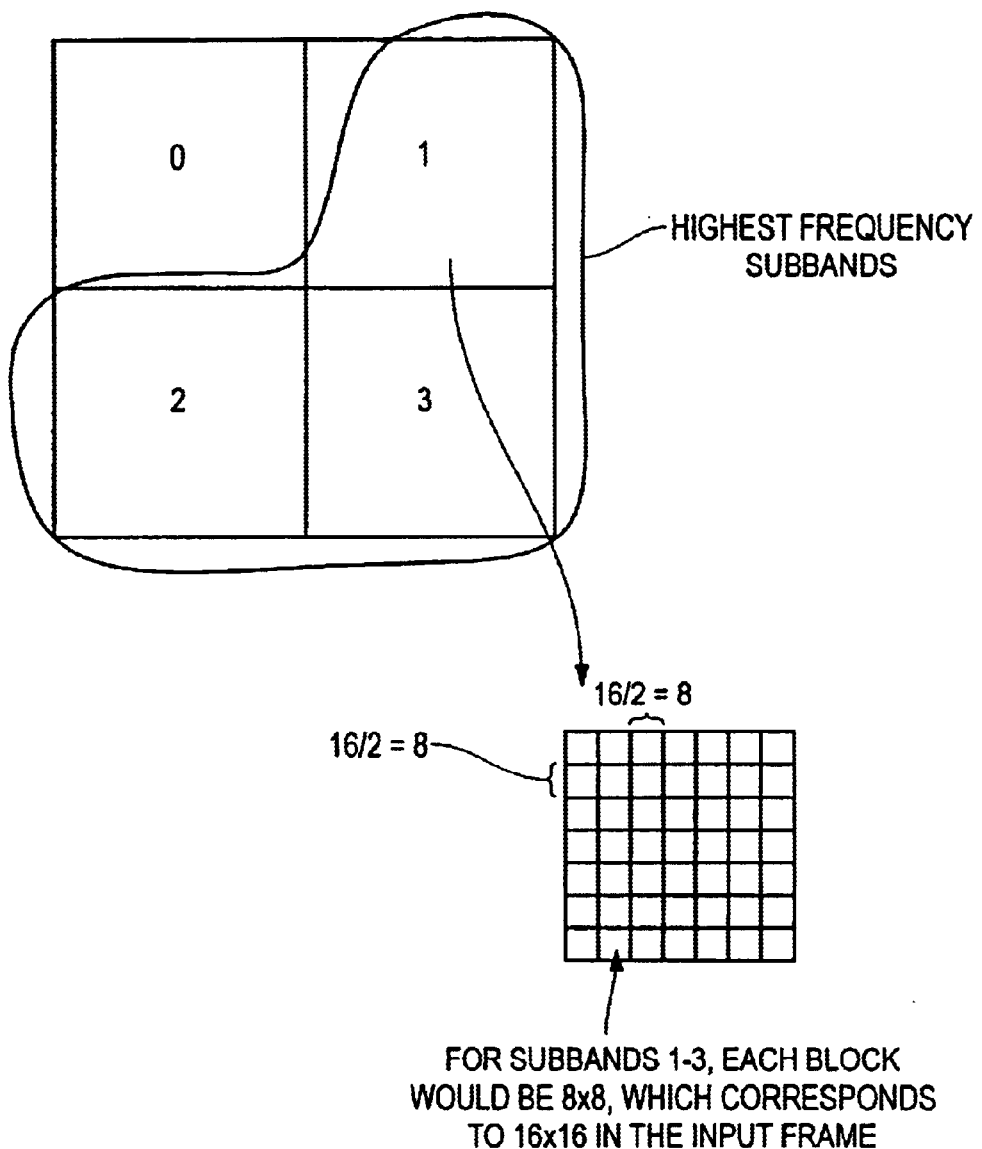
FIG. 11 is the initial frame configuration for the alternate method of FIG. 10 according to a preferred exemplary embodiment of the present invention.

In an alternate embodiment of the present invention, the initial and error frames are classified differently. Referring to FIG. 10, the alternate method 1000 implemented by the classifier is shown according to a preferred exemplary embodiment of the invention. The method 1000 begins with a query to determine whether the input frame is an initial frame or an error frame 1002. In the event that the input frame is an initial frame, the classification is performed on the highest-frequency subbands resulting from one level of wavelet decomposition (e.g., the three highest subbands (i.e., 1, 2, and 3) of the decomposition shown in FIG. 11). However, in the event that the input frame is an error frame the classification is performed on the error frame prior to wavelet decomposition. In either case, since the block size corresponds to 16×16 blocks in the input frame, the size of the global classification map remains unchanged, and the subsequent processing remains substantially the same. Note that for the initial frame, individual subband maps are constructed for the three highest-frequency subbands, with a majority used to construct the global class map. For an error frame, the block size is 16×16 since decomposition is not performed prior to classification. For both the initial frames and the error frames, any subband classification scheme can be implemented, such as the two exemplary methods shown in FIGS. 8 and 9.

Referring to FIG. 4, the statistical calculator 408 computes the variance and standard deviation values of the blocks within each subband assigned to the same class (i.e., subband class sequences), and the mean of each subband class sequence belonging to the lowest-frequency subband (e.g., subband zero of FIG. 5). More specifically, the mean ($\mu$) can be computed with equation (6), the variance ($\sigma^2$) can be computed according to equation (7) and the standard deviation ($\sigma$) can be computed with a square-root operation of equation (7).

$$\mu = \frac{1}{N_j} \sum_{i=1}^{N_j} x[i] \qquad (6)$$

$$\sigma^2 = \frac{1}{N_j - 1} \sum_{i=1}^{N_j} (x[i] - \mu)^2 \qquad (7)$$

Where $N_j$ is the number of coefficients from each subband assigned to class j, x[i] represents the coefficients within the blocks classified in a particular class j for each frequency subband, and $\mu$ is the mean of the considered subband-class sequence as described in equation (6). The resulting variance and standard deviation values computed with equations (6) and (7) are about equal to the product of the number of subbands and the number of classes. The Q scalar quantizer 410 quantizes the standard deviation values and the means of the lowest-frequency subband class sequences, and provides these values to the normalizer 412, which also preferably receives an all-pass filtered signal of the subband class sequence signal produced by the classifier 406. The Q scalar quantizer 410 also provides the quantized standard deviation values to the rate allocator 414.

The coding performance and noise robustness of the frame encoder 400 can be improved by all-pass filtering the wavelet coefficients with the phase scrambler 418. As can be appreciated, if a sequence with an arbitrary probability distribution is appropriately all-pass filtered, the resulting sequence will be a Gaussian distributed sequence. Further, if a fixed-rate (non-entropy-coded) quantization is employed, then a sizable gain in quantization performance may be realized with the all-pass filtering. Accordingly, the phase scrambler 418 is optionally provided to all-pass filter the signal to be quantized and produce a signal with Gaussian statistics.

The phase scrambler 418 receives each input subband class sequence (x(n)) from the classifier 406, transforms the input sequence (x(n)) using a fast Fourier transform (FFT), and separates the sequence into magnitude and phase components. The phase spectrum of an appropriate reference function is then added to the phase spectrum of the input sequence. An inverse FFT is performed, with the resulting output sequence (y(n)) having a near Gaussian distribution. In this way, the performance curve of a Gaussian-optimized quantizer can be achieved with a broad range of source distributions. In addition, the phase scrambler 418 provides a more secure bit stream between the encoder 400 and decoder 2100 (FIG. 1), and effectively distributes or "spreads" channel-induced noise throughout the image, thereby substantially reducing impulse artifacts in the decoded imagery.

A preferable reference function for the all-pass filtering operation is the binary pseudo-noise (PN) sequence, also known as the m-sequence. The m-sequence is preferable because of operation ease and autocorrelation properties. In the preferred embodiment, each subband class sequence is presented to the phase scrambler 418. The one-dimensional sequences of arbitrary length are then processed by a one-dimensional FFT, and separated into one-dimensional magnitude and phase sequences. Each phase sequence, corresponding to one of the subbands is then added to the phase sequence of a given reference function obtained with a one-dimensional FFT operation on the one-dimensional noise sequence, and collecting the one-dimensional phase sequence. The noise sequence is preferably generated from a feedback shift register corresponding to the 16th-order primitive polynomial $x^{16}+x^5+x^3+x+1$. The sequence is then truncated to the appropriate length, based upon the length of a given subband class sequence, prior to Fourier transformation, thus guaranteeing frequency-domain phase symmetry.

The normalizer 412 receives each subband class sequence, preferably the all-pass filtered signal produced by the phase scrambler 418, and the quantized mean and standard deviation values, and subtracts the means from the respective subband class sequences of the lowest frequency subband of each component (i.e., subband zero of FIG. 5), and divides substantially all sequences by the respective standard deviation to obtain a sequences with unit variance and zero mean, and the rate allocator 414 receives the quantized standard deviation values and calculates rate assignments for the corresponding sequences.

There are two levels of rate allocation in the presented encoder 118 (FIG. 1), GOP allocation by the frame rate allocator 128 (FIG. 1) and allocation of a bit rate for a frame among the wavelet coefficients of the rate allocator 414 (FIG. 4) of the frame encoder 400 (FIG. 4). Referring to FIG. 1, the frame rate allocator 128 allocates bits between the initial frame and the remaining error frames of a GOP 126. The rates for initial frame and error frame is preferably obtained, which minimizes the distortion of the entire GOP, subject to the given bit rate.

The frame rate allocator 128 for GOP rate allocation utilizes a heuristic sub-optimal rate allocation procedure. In this procedure, the same rate is utilized for substantially all and preferably all error frames within a GOP 126. The rate for the initial frame is chosen so that the peak signal to noise ratio (PSNR) of the coded initial frame does not significantly deviate from the average PSNR of the reconstructed error frames. Since fixed-rate (non-entropy-coded) quantization is preferably utilized in the present invention, the exact bit rate specification of each frame is optimized with this rate selection for the initial frame. After rates for the initial frame and the error frames of a GOP is determined by the frame rate allocator 128, the bit rate is allocated among the wavelet coefficients for each frame by the rate allocator 414 (FIG. 4).

Referring to FIG. 4, the overall mean-square error (MSE) incurred by encoding the subband-class sequences using the encoder 416 at an average rate of $R_T$ bits/coefficient is represented by:

$$E_s = \sum_{i=1}^{K} \alpha_i \sigma_i^2 E_i(r_i), \tag{8}$$

Where $\sigma_i^2$ is the variance of the sequence as calculated by the statistical calculator, $E_i(r_i)$ denotes the rate-distortion performance of the quantizer at $r_i$ bits/sample, K is the number of data sequences, and $\alpha_i$ is a weighting coefficient to account for the variability in sequence length (e.g., a 22-band decomposition and J classes, K=22J).

A rate allocation vector $B=(r_1, r_2, \ldots, r_K)$, is chosen by the rate allocator 414 such that $E_s$ is minimized, subject to an average rate constraint of:

$$\sum_{i=1}^{K} \alpha_i r_i \le R_T \text{ bits/coefficient} \tag{9}$$

The solution $B^*(r_1^*, r_2^*, \ldots, r_K^*)$ to the unconstrained problem of equation (3) minimizes $E_s$ subject to:

$$\sum_{i=1}^{K} \alpha_i r_i \le \sum_{i=1}^{K} \alpha_i r_i^*.$$

$$\min_{B} \left\{ \sum_{i=1}^{K} (\alpha_i \sigma_i^2 E_i(r_i) + \lambda \alpha_i r_i) \right\}, \tag{10}$$

Therefore, a solution to the constrained problem of equations (8) and (9) is obtained by the rate allocator 414 through identification of $\lambda$ such that the solution to equation (10) yields $$\sum_{i=1}^{K} \alpha_i r_i^* \le R_T.$$

The value of $\lambda$ corresponding to the minimum B can be obtained with a bisection search. More specifically, for a given $\lambda$, the solution to the unconstrained problem is obtained by separately minimizing each term of the sums in equation (10). If $S_j$ is the set of allowable rates for the $j^{th}$ quantizer, and $r_j^*$ is the $i^{th}$ component of the solution vector ($B^*$), then rates ($r_i^*$) are obtained by the rate allocator 414 as follows:

$$\min_{r_i \in S_j} \{\alpha_i \sigma_i^2 E_i(r_i) + \lambda \alpha_i r_i\}. \tag{11}$$

These rates are provided to the encoder 416 for allocation among the wavelet coefficients for each frame.

Figure 12:
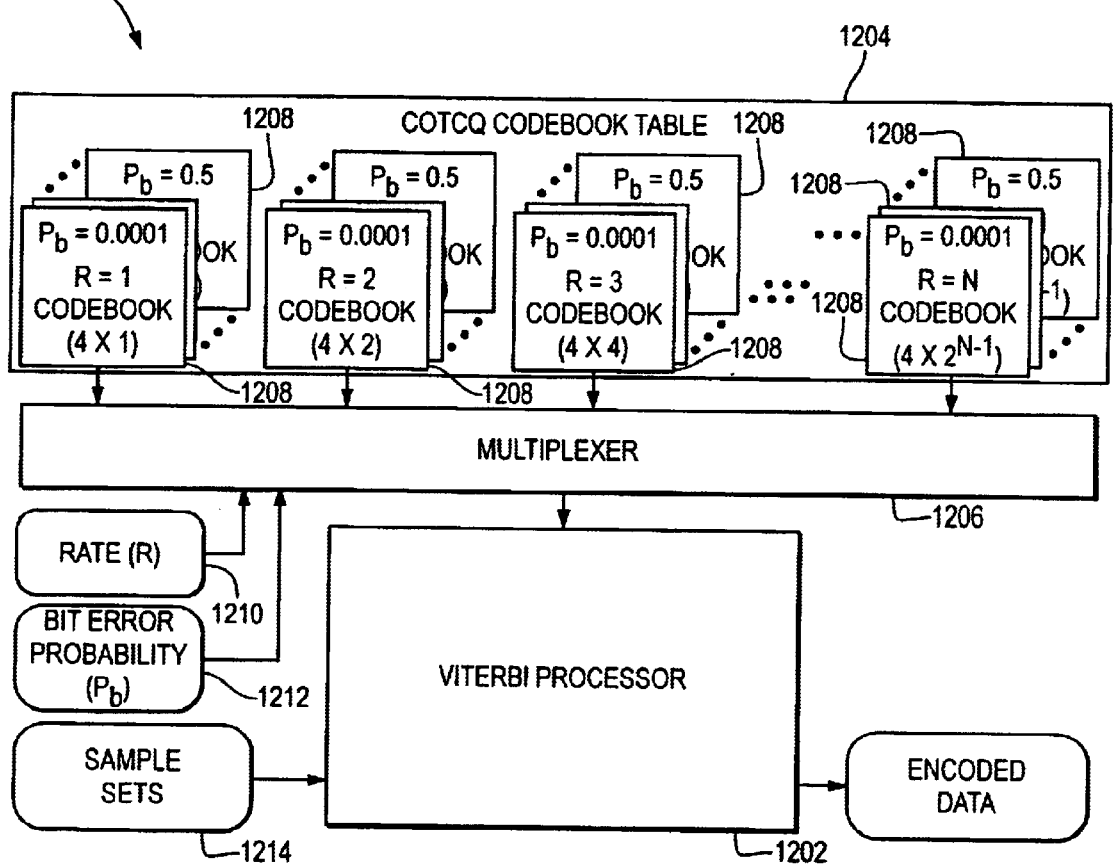
FIG. 12 is the encoder of FIG. 4 according to a preferred exemplary embodiment of the present invention.

Referring to FIG. 12, the encoder 416 is shown, which is preferably a channel-optimized trellis coded quantization (COTCQ) encoder configured with the assumption that the channel 112 (FIG. 1) is a memoryless and binary symmetric channel. In other words, the codebooks subsequently discussed are designed with the assumption that an error in one received bit has minimal influence on the error of other received bits. While configuration of the encoder as a COTCQ encoder with the aforementioned channel assumptions does provide beneficial results, beneficial results are also available without a COTCQ encoder and a COTCQ encoder that is configured with the assumption that the channel 112 (FIG. 1) is memoryless and binary symmetric.

The encoder 416 is configured to compress each of the subband class sequences (i.e., classification output sources ($X_i$)) classes that were formed by the classifier 406 (FIG. 4) that are associated with differing fixed rates. Preferably, the encoder 416 is configured to compress each of the classification output sources ($X_i$) at a fixed encoding bit rate in a channel-optimized manner, however optimization in this context does not imply an absolutely perfect or best possible solution. Rather, optimization indicates that the channel characteristics, such as the bit error probability ($P_b$) of the channel 112 (FIG. 1), have been considered in compression and a compression solution that considers channel characteristics provides a different and desirably better solution than the solution provided without considering channel characteristics. Since the channel characteristics are considered in the compression process of the encoder 416, preferably no error correction encoding is applied to the encoded data output of encoder 416.

The encoder 416, which is configured as a COTCQ encoder in this detailed description of a preferred exemplary embodiment, includes a Viterbi processor 1202, which is operatively coupled to a COTCQ codebook table 1204 with a multiplexer 1206. The COTCQ codebook table 1204 is preferably a memory structure that is configured to include multiple codebooks 1208. Each codebook 1208 is configured for a particular encoding bit rate (R) and a particular bit-error probability ($P_b$).

The encoding rate (R) parameter 1210 and bit error probability ($P_b$) parameter 1212 are supplied to the multiplexer 1206 such that one of the codebooks 1208 is provided to the Viterbi processor 1202 in addition to sample sets 1214 that include transform coefficient samples produced by the classifier 406 (FIG. 4), which have been preferably grouped for compression at a common fixed encoding bit rate. The encoding bit rate (R) 1210 changes for different sample sets and the bit error probability ($P_b$) 1212 may vary from time-to-time, but the rate (R) 1210 and bit error probability ($P_b$) 1212 preferably remain constant while the Viterbi processor 1202 is operating on a given sample set 1214. In one exemplary embodiment of the encoder 416, a single codebook 1208 is included for each rate that the sample sets 1214 are to be encoded by the encoder 416, and these codebooks 1208 are formed for a worst-case channel bit error probability ($P_b$) expected for the channel 116 (FIG. 1).

Figure 13:
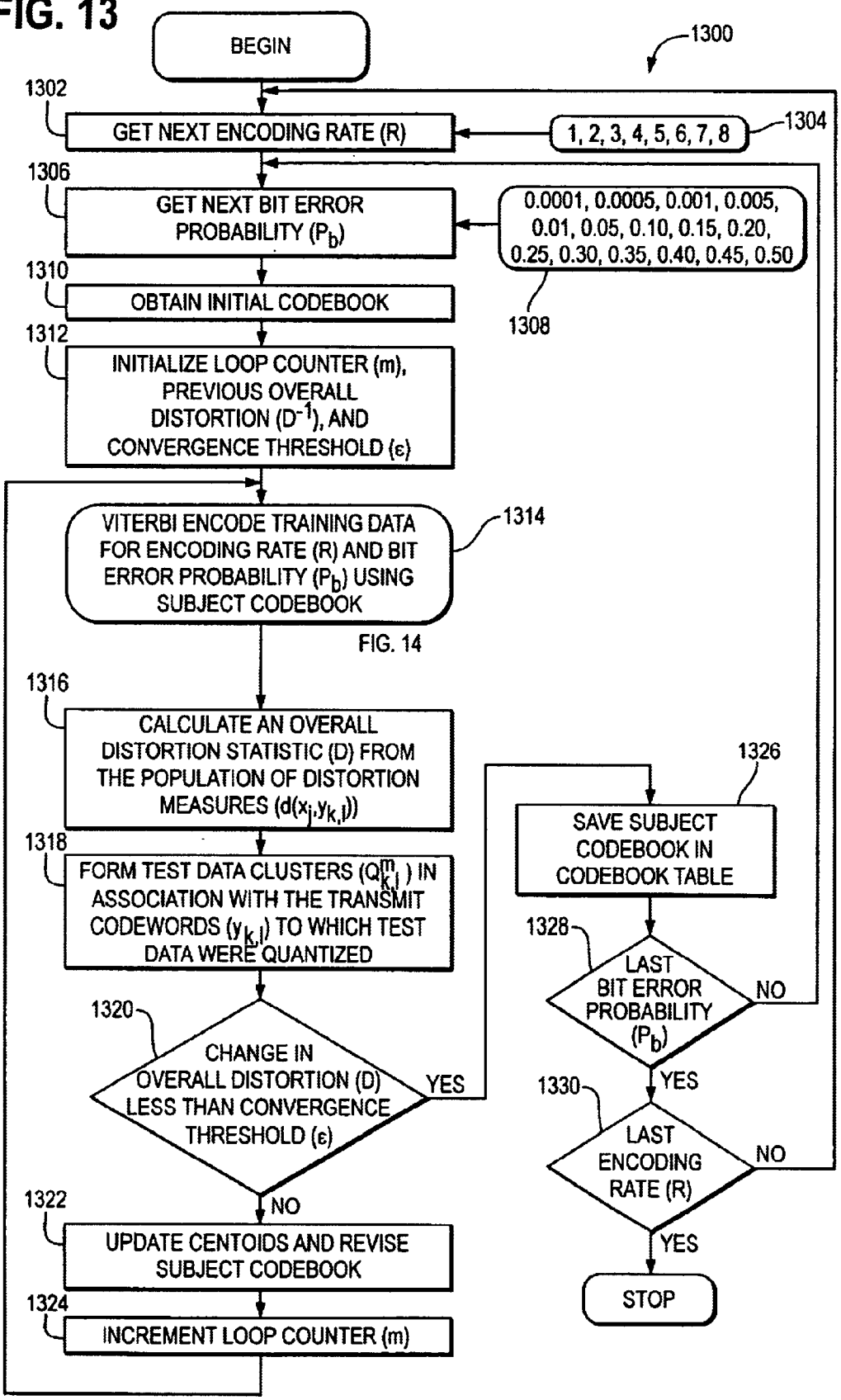
FIG. 13 is a flow chart illustrating a method of forming a codebook for the codebook table of the encoder of FIG. 12 according to a preferred exemplary embodiment of the present invention.

FIG. 13 is a flow chart of an exemplary codebook table formation process 1300 that is performed to form the codebooks 1208 stored in the codebook table 1204 (FIG. 12). The formation process 1300 is preferably performed before the encoder 416 (FIG. 12) compresses the classified output sources produced by the classifier 406 (FIG. 4). The formation process 1300 can be performed using the encoder 416 (FIG. 12) or a suitable processor (not shown) that is configured to simulate the operation of the encoder 416 (FIG. 12). For simplicity and convenience, the following discussion assumes that the encoder 416 (FIG. 12) is used to perform the formation process 1300, but this assumption is not a requirement of the present invention.

The formation process 1300 begins by obtaining an encoding rate (R) 1302 from a pool of encoding bit rates 1304 that includes a range of rates. For example, the pool of encoding bit rates 1304 may include a range of rates from one bit-per-sample to eight bits-per-sample in one-bit increments. After an encoding rate (R) is obtained 1302 from the pool of encoding bit rates 1304, a bit error probability ($P_b$) is obtained 1306 from a pool of bit error probabilities 1308 the includes a range of bit error probabilities. For example, the pool of bit error probabilities may include fifteen different bit error probabilities ranging from 0.0001 to 0.50. Preferably, the lowest bit error probability ($P_b$) is obtained that has not been previously evaluated in the formation process 1300.

After the bit error probability ($P_b$) is obtained from the pool of bit error probabilities 1308, an initial codebook is obtained 1310 for the encoding rate (R) 1302. The initial codebook is modified using a K-means algorithm to produce a codebook 1208 (FIG. 12) that is acceptable for the bit error probability ($P_b$). For iterations of the formation process 1300 other than the initial iteration, a codebook 1208 (FIG. 12) from a previous iteration is obtained that was formed for the same rate (R) and modified to produce another codebook that is acceptable for a bit error probability ($P_b$) that is as close as possible to, but less than, the current bit error probability ($P_b$). For example, an initial codebook may be obtained 1310 in the initial iteration that is configured for the current rate (R) and bit error probability ($P_b$) of 0.0. Such a codebook represents a conventional non-channel-optimized trellis-coded quantizer codebook formed with the assumption of an error-free transmission. The use of an initial codebook that is configured for the same rate (R) and a slightly lower bit error probability ($P_b$) is desirable as the odds of the K-means algorithm converging to a codebook solution is improved for the bit error probability ($P_b$)of the current codebook.

Once the encoding rate (R), next bit error probability ($P_b$) and initial codebook are obtained (1302,1306,1310), parameter initializing 1312 is conducted for an operation that will repeat to form different codebooks until changes in overall distortion from the codebooks appear to be below a predetermined threshold. For example, a loop counter (m) is initialized that tracks the number of operation iterations, a value ($D^{-1}$) that characterizes the overall distortion for a previous iteration of the formation process is initialized to a large positive number, and a convergence threshold ($\epsilon$) is initialized during parameter initialization 1312. Following parameter initialization 1312, the formation process 1300 repetitively modifies and refines the initial codebook and revised codebooks until improvement in overall distortion (D) ceases.

As a part of this repetitive modification and revision, the formation process 1300 performs a Viterbi encoding 1314, which uses a Viterbi-type algorithm to encode training data for the current encoding bit rate (R) and bit error probability ($P_b$) using the initial or revised codebook. The training data need not be real data, which has been decomposed from an image, or other to-be-communicated data, but may simply be a random sample set which includes random data expressed as numerous samples.

Figure 14:
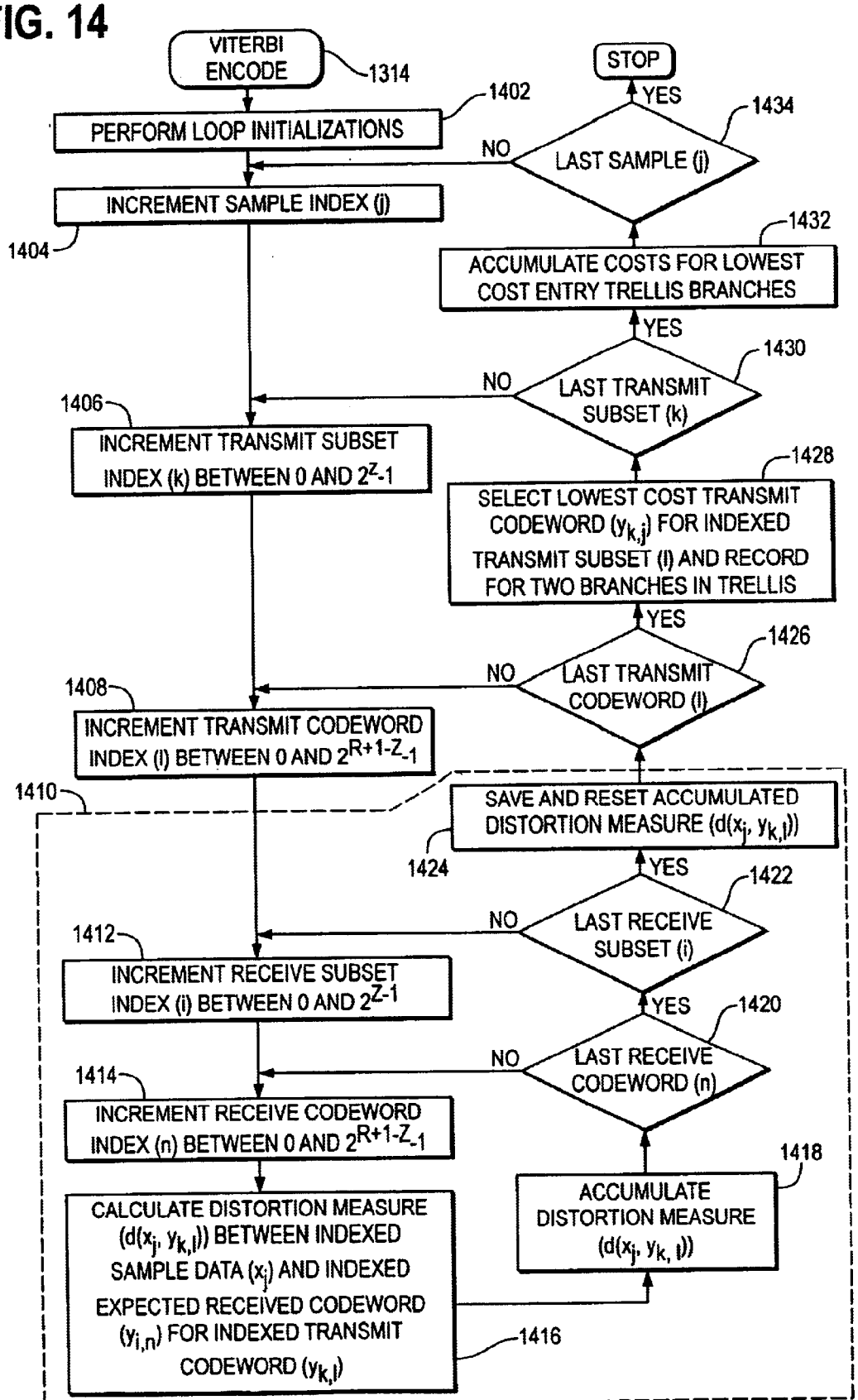
FIG. 14 is a flow chart illustrating a method of Viterbi encoding performed by the method of FIG. 13 according to a preferred exemplary embodiment of the present invention.

FIG. 14 is a flow chart of an exemplary Viterbi encoding 1314 performed by the formation process 1300 of FIG. 13. The Viterbi encoding 1314 is preferably performed by the Viterbi processor 1202 (FIG. 12) using a specific codebook 1208 (FIG. 12), encoding bit rate (R) and bit error probability ($P_b$), which are established prior to performing the Viterbi encoding 1314 and preferably remain constant throughout the Viterbi encoding 1314.

Figure 15:
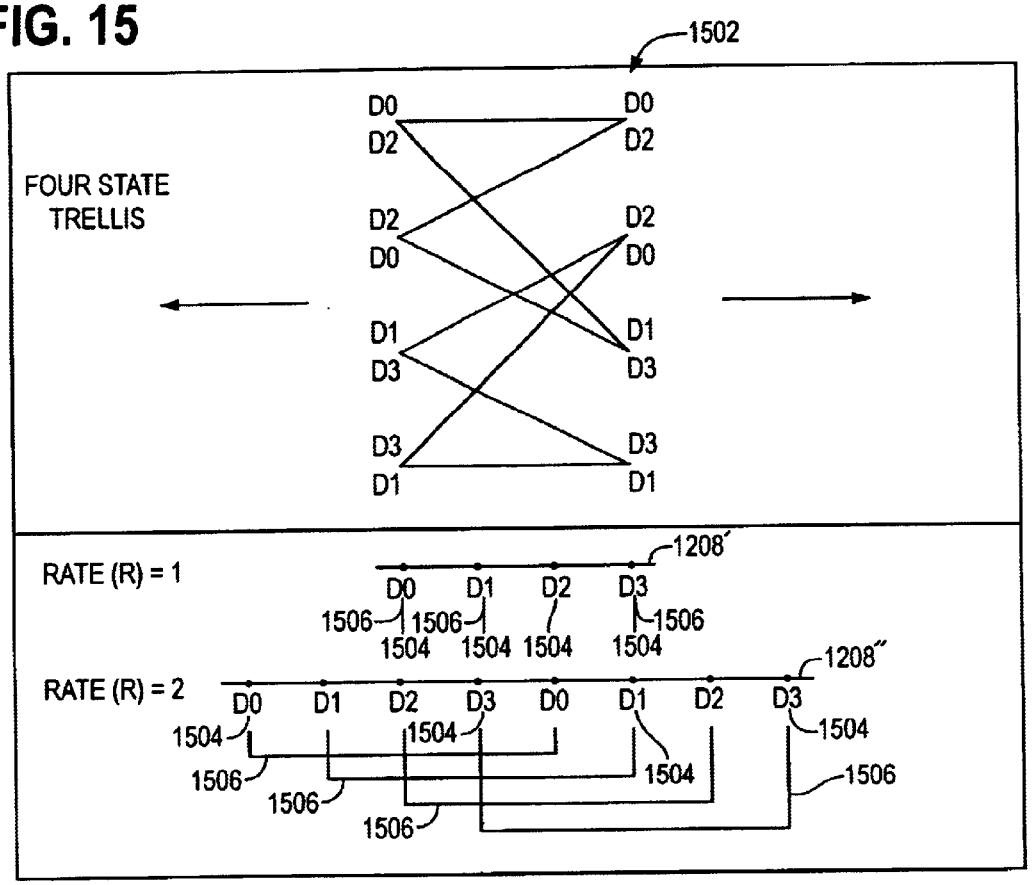
FIG. 15 is a four-state trellis implemented through the Viterbi encoding process of FIG. 14 according to a preferred exemplary embodiment of the present invention.

For example, FIG. 15 illustrates an exemplary trellis 1502 that may be implemented through the Viterbi encoding 1314 of FIG. 14. The Viterbi encoding 1314 performs a Viterbi encoding in accordance with the trellis 1502 for $2^Z$ states, where Z is a positive integer. In a preferred embodiment, Z is 2 so that the trellis 1502 has four states. However, the trellis 1502 may be adapted to have more than four states for performance improvements, but such performance improvements may be too slight to justify the resulting increase in computational complexity for mobile and portable devices.

FIG. 15 also illustrates first exemplary codebooks 1208' and second exemplary codebooks 1208" having $2^{R+1}$ codewords 1504 for encoding bit rates (R) of one and two, respectively (i.e., R=1 and R=2). FIG. 15 also shows an assignment of codewords 1504 to the states of the trellis 1502. Since the trellis 1502 has $2^Z$ states, codewords 1504 are grouped together into $2^Z$ subsets 1506, with $2^{R+1-Z}$ codewords per subset 1506. For z equal to two and an encoding bit rate (R) equal to one, only one codeword 1504 is included in each subset 1506. In other words, each codeword 1504 is a subset 1506. For an encoding bit rate (R) equal to two, two codewords 1504 are included in each subset 1506. Where Z is equal to two and the encoding bit rate (R) is eight (i.e., R=8)(not shown), each of four subsets 1506 includes one hundred and twenty eight codewords 1504.

Referring to FIGS. 14 and 15, the Viterbi encoding 1314 performs loop initializations 1402 for a loop that will be repeated for each sample in the current sample set 1214 (FIG. 12). Therefore, the loop initializations 1402 will be used for substantially all samples in the sample set 1214 (FIG. 12). The loop initializations 1402 are subsequently discussed in more detail for a specific embodiment of Viterbi encoding 1314, which is beneficial for use when the encoder 416 (FIGS. 12) operates to encode data other than the training sequence.

Following the loop initializations 1402, a sample index (j) is incremented 1404 to point to the next sample within the sample set 1214 (FIG. 12), and a transmit subset index (k) is also incremented 1406 after incrementing the sample index (j) 1404. Since the codewords 1504 are grouped into $2^Z$ subsets 1506, the transmit subset index (k) is preferably incremented from zero to $2^Z-1$ in increments of one so that the transmit subset index (k) identifies one of the subsets 1506. Furthermore, the transmit subset index (k) identifies one subset 1506 of the codewords 1504, which may be transmitted from the transmitter 112 (FIG. 1) and distinguished from the codewords 1504 that are received at the receiver 114 (FIG. 1). Due to the presence of noise in the channel 116 (FIG. 1), as characterized through bit error probability ($P_b$), a transmitted codeword 1504 may not be the same as a received codeword 1504.

Once the sample index (j) is incremented 1404 and the transmit subset index (k) is incremented 1406, a transmit codeword index (l) is incremented 1408 in the Viterbi encoding 1314. Since each subset 1506 includes $2^{R+1-Z}$ codewords 1504, the transmit codeword index (l) is preferably incremented from zero TO $2^{R+1-Z}-1$ in increments of one, so that the transmit codeword index (l) identifies one of the codewords 1504 within the subset 1506 identified by transmit subset index (k). As with transmit subset index (k), the transmit codeword index (l) identifies a codeword 1504, which may be transmitted from the transmitter 112 (FIG. 1) and distinguished from codewords 1504 received at the receiver 114 (FIG. 1).

Once the transmit codeword index (l) is incremented, the Viterbi encoding 1314 performs calculations for a transmittable codeword set 1410. The calculations for a transmittable codeword set 1410 are preferably performed at least once for each of the $2^{R+1}$ transmittable codewords 1504 included in the current codebook 1208 (FIG. 12), and repeated for each of the J samples in the sample set 1214 (FIG. 12). In general, the calculations for a transmittable codeword set 1410 determines a measure of distortion $d(x_j, y_{k,l})$ that characterizes substantially all codewords 1504, which may be received when a given codeword 1504 is transmitted with transmit subset index (k) and transmit codeword index (l) identification. The measure of distortion $d(x_j, y_{k,l})$ is determined with respect to the current sample under evaluation.

More particularly, consider an input sample sequence $X=\{x_j\}_{j=1}^J$ of a sample set 1214 (FIG. 12), where J denotes the number of samples in the input sample sequence X. Let $Y=\{x_{k,l}\}$ be the set of codewords for $0 \leq k < 4$, $0 \leq l < 2^{R+1-Z}$, where $y_{k,l}$ denotes the codeword corresponding the $1^{th}$ codeword of the $k^{th}$ subset 1506. The measure of distortion $d(x_j, y_{k,l})$ between $x_j$ and $y_{k,l}$ is calculated for a transmittable codeword set 1410 as follows:

$$d(x_j, y_{k,l}) = \sum_{i=\phi}^{N_1-1} \sum_{n=o}^{N_2-1} P_{i,n|k,l}(x_j - y_{i,n})^2 \qquad (12)$$

where, $N_1=2^Z$; $N_2=2^{R+1-Z}$, and $(P_{i,n|k,l})=\Pr(y_{i,n}$ is received$|y_{k,l}$ is sent).

Figure 16:
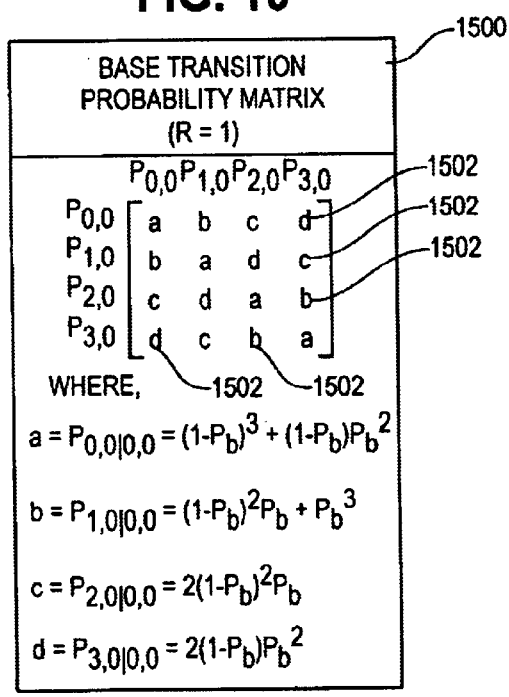
FIG. 16 is a table of a base transition probability matrix used by the Viterbi encoding process of FIG. 14 according to a preferred exemplary embodiment of the present invention.
Figure 17:
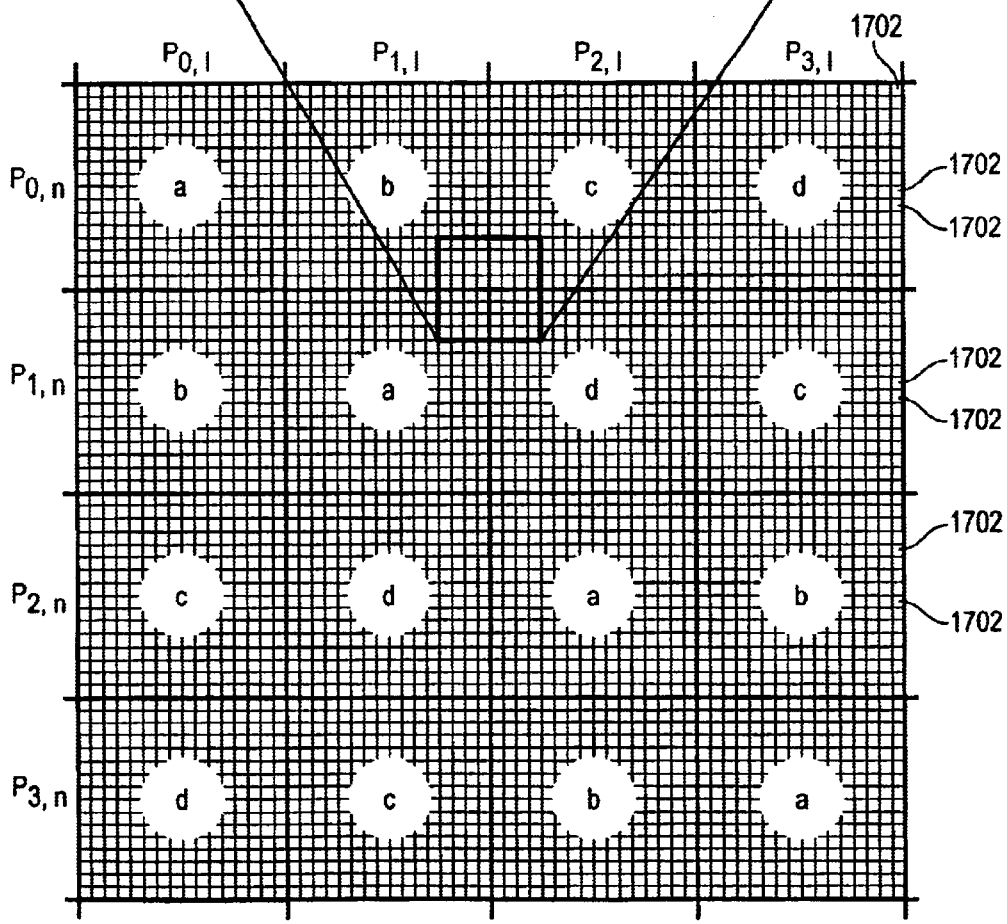
FIG. 17 is a transition probability matrix for a rate of five according to a preferred exemplary embodiment of the present invention.

Referring to FIG. 16, an exemplary base transition probability matrix 1600 is shown that is preferably used by the Viterbi encoding 1314 (FIG. 13). The base transition probability matrix 1600 sets forth channel transition probabilities 1602 for a situation where the encoding rate is one (i.e., R=1). FIG. 17 shows an exemplary transition probability matrix 1700 for an encoding bit rate of five (i.e., R=5). Referring to FIGS. 16 and 17, transition probability matrix (1600,1700) sets forth probabilities associated with specific codewords 1504 (FIG. 15). Each codeword 1504 (FIG. 15) has a column and a row in the transition probability matrix (1600,1700). The columns of the transition probability matrix (1600,1700) may represent transmittable codewords 1504 (FIG. 15) while the rows may represent receivable codewords 1504 (FIG. 15), or vice-versa. The channel transition probabilities (1602,1702) are responsive to bit error probability ($P_b$), and the structure of the trellis 1502 (FIG. 15) specifies the branches followed during transitions between states. Therefore, channel transition probabilities (1602,1702) are responsive to and reflect the trellis 1502 (FIG. 15).

In particular, for a preferred four state trellis 1502 (FIG. 15) (i.e., Z=2), a Viterbi decoder operating on received codewords may exhibit any of the four states at any unit interval depending upon the number of bit errors that may or may not have occurred in the current and two previous unit intervals. For each transmittable codeword 1504 (FIG. 15), transition probability matrix (1600,1700) assigns probabilities that a Viterbi decoder operating on the received codewords will exhibit for the various states associated with the possible receivable codewords 1504 (FIG. 15).

As shown in FIG. 16, when the encoding bit rate is 1 (i.e., R=1), the determination of channel transition probabilities 1602 is straightforward given a specific trellis 1502 (FIG. 15). As illustrated in FIG. 17, channel transition probabilities 1702 increase in complexity as the encoding bit rate (R) increases. However, channel transition probabilities 1702 in a preferred embodiment for encoding bit rates greater than one (i.e., R>1) can be determined for any encoding bit rate (R) by evaluating correspondence between the base transition probability matrix 1700 (FIG. 17) and the hamming distance between the codeword indices (n,l), referred to herein as Hamming(n⊕l). The hamming distance, also referred to as a signal distance, describes the number of digit positions in which the corresponding digits of two binary words of the same length are different. In this situation, the codeword indices (n,l) are each expressed as binary numbers having a length of R+1−Z. Specifically, channel transition probabilities 1702 may be calculated for any encoding bit rate (R) and channel bit error probability ($P_b$) as follows:

$$P_{i,n/k,l} = P_{i,0/k,0}^{R-1}(1-P_b)^{R+1-Z-Hamming(l/\oplus n)} P_b^{Hamming(l\oplus n)} \qquad (13)$$

Where $P_{i,0/k,0}^{R-1}$ is the base transition probability for transmit subset (K) and receive subset (i).

Referring to FIG. 14, equation (12) is solved for a transmittable codeword identified by the transmit subset and codeword indices (k,l) using the channel transition probabilities calculated with equation (13) in the calculations for a transmittable codeword set 1410. The calculations for a transmittable codeword set 1410 includes incrementing a receive subset index (i) 1412. Since codewords 1504 (FIG. 15) are grouped into $2^Z$ subsets 1506 (FIG. 15), the receive subset index (i) is incremented between the values of zero and $2^Z-1$ in increments of one so that the receive subset index (i) identifies one of the subsets 1506 (FIG. 15). Furthermore, the receive subset index (i) identifies one subset of codewords, which are receivable at the receiver 114 (FIG. 1) as distinguished from codewords, which are transmittable from the transmitter 112 (FIG. 1) and identified by the first codeword index (k).

After the receive subset index (i) is incremented 1412, a codeword index (n) is incremented 1414 in the calculations for a transmittable codeword set 1410. Since each subset 9012 (FIG. 9) includes $2^{R+1-Z}$ codewords 1504 (FIG. 15), the codeword index (n) is preferably incremented 1414 between the values of zero and $2^{R+1-Z}-1$ in increments of one so that the codeword index (n) identifies a codeword 1504 (FIG. 15) within the subset 1506 (FIG. 15) that is identified by the receive subset index (i). As with the receive subset index (i), the codeword index (n) identifies a codeword 1504 (FIG. 15), which is receivable at the receiver 114 (FIG. 1) as distinguished from a codeword 1504 (FIG. 15), which is transmittable from the transmitter 112 (FIG. 1) and identified by the codeword index (l).

Once the receive subset index (i) is incremented 1412 and the receive codeword index (n) is incremented 1414, a measure of distortion ($d(x_j,y_{k,l})$) is calculated for the receivable codeword identified by receive subset index (i) the codeword index (n) 1416, the transmittable codeword identified by the transmit subset index (k) and the codeword index (l). In a preferred embodiment, the measure of distortion ($d(x_j,y_{k,l})$) characterizes the mean squared error (MSE) between an input sample ($x_j$) and the expected value for the indexed receivable codeword given transmission of the indexed transmittable codeword. As previously discussed in this detailed description, this measure of distortion ($d(x_j,y_{k,l})$) is responsive to the channel transition probability ($P_b$), base channel transition probabilities 1602 (FIG. 16), and hamming distance (Hamming(n⊕l)) between the transmit codeword index (l) and receive codeword index (n).

The measures of distortion ($d(x_j,y_{k,l})$) are accumulated 1418 to produce a cumulative total, and a determination is made as to whether the last receive codeword for this transmit codeword and receive subset has been evaluated for the measures of distortion ($d(x_j,y_{k,l})$) 1420. In other words, a determination is made as to whether the receive codeword 1504 (FIG. 15) with a receive codeword index (n) equal to $2^{R+1-Z}-1$ has been processed in this loop. So long as the last receive codeword for the current transmit codeword and receive subset has not been evaluated, the receive codeword index (n) is incremented 1414 and a measure of distortion ($d(x_j,y_{k,l})$) is calculated for the receivable codeword identified by the receive subset index (i), the codeword index (n) 1416, and the transmittable codeword identified by transmit subset index (k) and codeword index (l).

Once the last receive codeword for this transmit codeword and receive subset has been evaluated for measures of distortion ($d(x_j,y_{k,l})$) 1420, a query is made to determine whether the last receive subset for this transmit codeword has been evaluated 1422 in the calculations for a transmittable codeword set 1410. In other words, a query is made to determine whether the receive subset 1506 (FIG. 15) having a receive subset index (i) of $2^Z-1$ has been processed in the calculations for a transmittable codeword set 1410. So long as the last receive subset for the current transmit codeword has not yet been evaluated, the receive subset index (i) is incremented 1412, the receive codeword index (n) is incremented 1414, and the measure of distortion is calculated 1414 until substantially all possible receivable subsets have been evaluated in the process. Once substantially all possible receivable subsets have been evaluated in the process, the accumulated measure of distortion is saved and reset 1424. At this point, a measure of distortion $d(x_j,y_{k,l})$ is available for the current transmittable codeword 1504 (FIG. 15), and the Viterbi encoding 1314 discontinues the calculations for a transmittable codeword set 1410, which has been calculated C times, where $C=2^{R+1}$.

After possible receivable subsets have been evaluated in the process and the accumulated measure of distortion is saved and reset 1424, a query is made to determine whether the last transmit codeword for this transmit subset has been evaluated in this process. In other words, a query is made to determine whether the last transmittable codeword 1504 (FIG. 15) has been processed 1428 by the Viterbi encoding 1314 (i.e., the transmit codeword index (l) is equal to $2^{R+1-Z}-1$). So long as the last transmittable codeword for the current transmit subset has not yet been evaluated, the Viterbi encoding 1314 preferably continues to process receivable codewords for substantially all transmittable codewords for the current transmit subset.

When the final transmit codeword is discovered for the current transmit subset, a comparison is made between the measures of distortion ($d(x_j,y_{k,l})$) 1428 saved in previous calculations for a transmittable codeword set 1410. The comparison between the measures of distortion ($d(x_j,y_{k,l})$) 1428 is preferably conducted to identify the lowest cost transmit codeword. In other words, the comparison between the measures of distortion ($d(x_j,y_{k,l})$) 1428 is conducted to find the lowest measure of distortion ($d(x_j,y_{k,l})$) over the transmittable codewords 1504 (FIG. 15) and possible receivable codewords for each of the transmittable codewords within the current transmit subset 1506 (FIG. 15). This lowest cost transmit codeword is recorded in the trellis 1502 (FIG. 15) in two locations as dictated by the trellis structure.

Once the lowest cost transmit codeword is selected and recorded in the trellis 1428, a determination is made as to whether the last transmit subset has been evaluated 1430 in the Viterbi encoding 1314 (i.e., whether the transmit subset index (k) is equal to $2^Z-1$) So long as the last transmit subset has not yet been evaluated, the Viterbi encoding 1314 preferably continues for each possible transmittable subset. Since the calculations for a transmittable codeword set 1410 is repeated C times for each of C transmittable codewords 1504 (FIG. 15), where $C=2^{R+1}$, the calculations for a transmittable codeword set 1410 are performed at least $C^2$ times before the Viterbi encoding 1314 encounters the last transmittable subset for the current sample.

When the last transmittable subset 1506 has been evaluated, Viterbi encoding 1314 accumulates the lowest costs 1432 recorded in the trellis 1502 (FIG. 15). Each state in the trellis 1502 (FIG. 15) has a pair of entry branches. For each entry branch pair, the branch having the higher cumulative cost is ignored and adding the costs to the previous cumulative total forms a cumulative total for the costs of the remaining branch. Once the lowest costs 1432 recorded in the trellis 1502 (FIG. 15) are accumulated 1432, a determination is made as to whether the last sample from the current sample set has been processed in the Viterbi encoding 1314. If the last sample has not yet been processed, the evaluation continues for substantially all possible transmittable and receivable codewords 1504 (FIG. 15). If the Viterbi encoding 1314 for the last sample is completed, the Viterbi encoding 1314 is discontinued, the formation process 1300 (FIG. 13) is reentered, and an overall distortion statistic (D) is calculated 1306 as shown in FIG. 13.

Referring to FIG. 13, the overall distortion statistic (D) is determined from a population of distortion measures ($d(x_j, y_{k,l})$) 1316. In particular, the overall distortion statistic (D) may be determined as follows:

$$D = \frac{1}{J}\sum_{j=o}^{J-1} d(x_j, y_{k,l}) \tag{14}$$

After the distortion statistic (D) is determined from a population of distortion measures ($d(x_j,y_{k,l})$) 1316, test data clusters are formed in association with the transmittable codewords ($y_{k,l}$) to which test data were quantized 1318 in the previous iteration of Viterbi encoding 1314. In other words, test data is encoded using a particular transmittable codeword 1504 (FIG. 15) from the current codebook 1208 (FIG. 12), and clustered together to form one cluster for each transmittable codeword 1504 (FIG. 15).

Once the over distortion is calculated 1316 and the test data cluster is formed 1318, a comparison is made between the overall distortion statistic from the previous iteration ($D^{-1}$) of the formation process 1314 and the overall distortion statistic (D) 1320. In particular, the comparison 1320 is made with respect to the following inequality:

$$\frac{D^{(m-1)} - D^{(m)}}{D^{(m)}} < \varepsilon. \qquad (15)$$

Unless the overall distortion change $$\left(\text{i.e., } \frac{D^{(m-1)} - D^{(m)}}{D^{(m)}}\right)$$

is about less than the convergence threshold (ε), the formation process 1314 is repeated for the current rate (R) and bit error probability (P$_b$), including an update of centroids and revision of the codebook 1322.

The centroids are updated by calculating the mean for each of the clusters as follows:

$$y_{i,n}^{(m+1)} = \frac{\Sigma x_j \in Q_{k,l}^{(m)} x_j}{\sum_{k=o}^{N_1-1} \sum_{l=0}^{N_2-1} P_{i,n|k,l} \|Q_{k,l}\|^{(m)}} \qquad (16)$$

Where $\|Q_{k,l}\|$ is the number of input samples assigned to codeword $y_{k,l}^{(m)}$. The updated centroids are used as codewords 1504 (FIG. 15) for a revised codebook 1208. Once the centroids are updated and the revised codebook is generated 1322, the loop counter (m) is incremented 1324, and the Viterbi encoding 1314 is reentered for the test data using the revised codebook 1208, but for the same rate (R) and bit error probability (P$_b$).

When the change in overall distortion (D) has diminished below the convergence threshold (ε), the subject codebook 1208 (FIG. 12) is saved in the codebook table 1204 (FIG. 12) 1326, and a query is made to determine whether a codebook 1208 for the current encoding bit rate (R) has been formed for the last bit error probability (P$_b$) in the pool of bit error probabilities 1308. If another bit error probability (P$_b$) remains for which no codebook 1208 (FIG. 12) has been formed, the formation process 1314 obtains the next bit error probability 1306 and continues to generate another codebook 1208 for the current encoding bit rate (R) and the new bit error probability (P$_b$).

When the determination is made that the last bit error probability (P$_b$) has been processed 1328, a query is made to determine whether codebooks 1208 have been formed for the last encoding bit rate (R) in the pool of encoding bit rates 1304. So long as codebooks have not been formed for substantially all the encoding bit rates (R) in the pool of encoding bit rates 1304, the formation process 1314 obtains the next encoding rate(R) 1302 and continues to form codebooks 1208 for the next encoding rate (R). However, when codebooks have been formed for substantially all the encoding rates (R) in the pool of encoding bit rates 1304, the formation process 1300 is complete and the encoder 416 (FIG. 12) may be used to encode real data. In an alternate embodiment, codebooks 1208 are saved that are formed for the highest bit error probabilities (P$_b$) in each encoding bit rate (R). This alternate embodiment reduces complexity and has minimal affect on performance.

Figure 18:
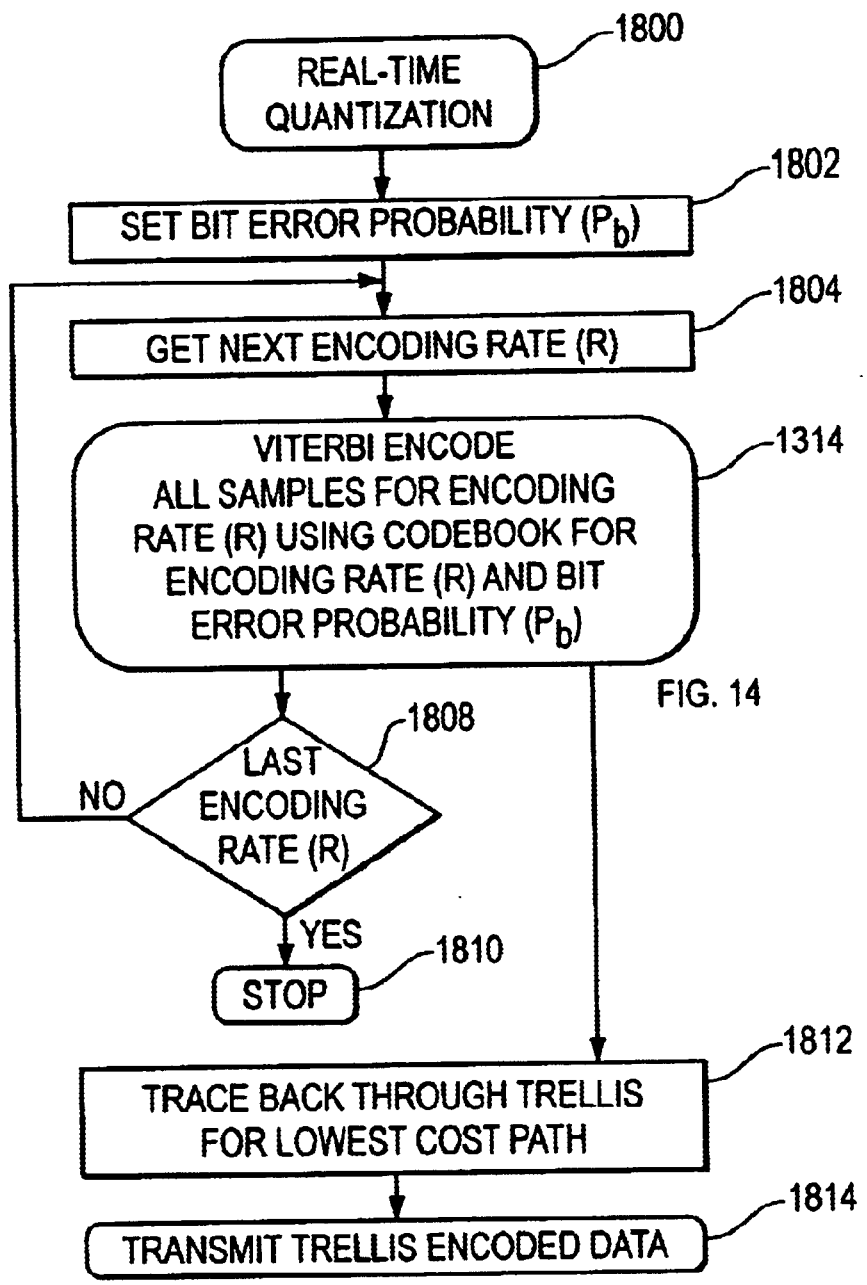
FIG. 18 is a flow chart illustrating a method of real-time quantization performed by the encoder of FIG. 12 according to a preferred exemplary embodiment of the present invention.

FIG. 18 is an exemplary real-time quantization process 1800 performed by the encoder 416 (FIG. 12). The real-time quantization process 1800 is illustrated for the encoder 416 (FIG. 12) of the transmitter 112 (FIG. 1), but the receiver 114 will be configured to perform an inverse process of the real-time quantization process 1800. The real-time quantization process 1800 includes setting the bit error probability (P$_b$) 1212 (FIG. 12) for the channel 116 (FIG. 1) 1802. The bit error probability (P$_b$) 1212 (FIG. 12) may be set in any convenient manner. For example, the transmitter 112 (FIG. 1) may begin communications with a worst-case bit error probability (P$_b$), and reduce the bit error probability (P$_b$) over time until a desired performance appears to have been achieved by a particular reduction. In an alternate embodiment, the bit error probability (P$_b$) may be set to a predetermined worst-case value for the channel 116 (FIG. 1), and held constant throughout a communication session. The setting of the bit error probability (P$_b$) 1212 (FIG. 12) for the channel 116 has the effect of selecting a set of codebooks 1208 (FIG. 12) in the codebook table 1204 (FIG. 12), where each of the selected codebooks 1208 (FIG. 12) is designed, as previously discussed for a different encoding bit rate (R).

After the bit error probability (P$_b$) is set 1802, the real-time quantization process 1800 performs the Viterbi encoding process 1314 (FIG. 14) for different sample sets 1214 (FIG. 12), where each of the different sample sets is encoded at a different encoding bit rate (R). Therefore, an encoding bit rate (R) is obtained 1804 at which the Viterbi encoding 1314 will encode the sample sets 1214 (FIG. 12). The next encoding bit rate (R) may be obtained from a pool of encoding bit rates (R) similar to the pool of encoding bit rates (R) 1304 described in conjunction with FIG. 13. Specification of the next encoding bit rate (R), when considered with the bit error probability (P$_b$), has the effect of selecting a single codebook 1208 (FIG. 12) from codebook table 1204 (FIG. 12).

After the next encoding bit rate (R) is obtained 1804, Viterbi encoding 1314 is performed as previously described in this detailed description. However, the Viterbi encoding 1314 is performed on a set of real samples rather than training data. The Viterbi encoding 1314 performs channel-optimized trellis-coded quantization for the encoding bit rate (R) and bit error probability (P$_b$) established in the immediately preceding iteration of bit error probability (P$_b$) selection 1802 and next encoding rate selection (R) 1804. Once the Viterbi encoding 1314 is completed, a determination is made as to whether the sample set 1214 (FIG. 12) for the last encoding bit rate (R) has been processed 1808 by Viterbi encoding 1314. So long as sample sets 1214 (FIG. 12) for additional encoding bit rates (R) remain for processing, the next encoding bit rate (R) is obtained in the real-time quantization 1800. When the last encoding bit rate (R) is identified, the real-time quantization preferably ceases 1810. At this point, the to-be-communicated data has been communicated through the channel 116 (FIG. 1). Of course, real-time quantization 1800 may be repeated at any time, and such repetition may immediately take place to communicate video or other real-time data.

In parallel with the determination as to whether the sample set 1214 (FIG. 12) for the last encoding bit rate (R) has been processed 1808 by Viterbi encoding 1314 and the continuing Viterbi encoding 1314 for the next encoding bit rate (R) 1204, the real-time quantization 1800 preferably processes the output of the Viterbi encoding 1314. In particular, the real-time quantization 1800 using the trellis 1502 (FIG. 15), which has been constructed for substantially all samples in sample set 1214 (FIG. 12), to find the lowest cost path through the trellis 1502 (FIG. 15). In other words, for each sample characterized in the trellis 1502 (FIG. 15), the branches are identified that are associated with the lowest cumulative measures of distortion ($d(x_j, y_{k,l})$). Following the identification of the lowest cost path through the trellis 1502 (FIG. 15) 1212, the trellis encoded data specified by the lowest cost path is transmitted through the channel 116 (FIG. 1).

As previously discussed with reference to FIG. 14, the o 10 Viterbi encoding 1314 performs at least $JC^2$ calculations of the measure of distortion $d(x_j,y_{k,l})$ in processing a sample set 1214 (FIG. 12), where J is the number of samples in the sample set and C represents the number of codewords in the codebook (i.e., $C=2^{R+1}$) While the computational complexity of the Viterbi encoding 1314 is of little significance in the formation of codebooks 1208 (FIG. 12) from training sequences, computational complexity has greater significance when processing real data, particularly when such processing occurs in mobile or portable devices. Generally, as the number of required computations within a given period of time increases, power consumption also increases. Accordingly, decreasing the number of computations decreases the power consumption.

Figure 19:
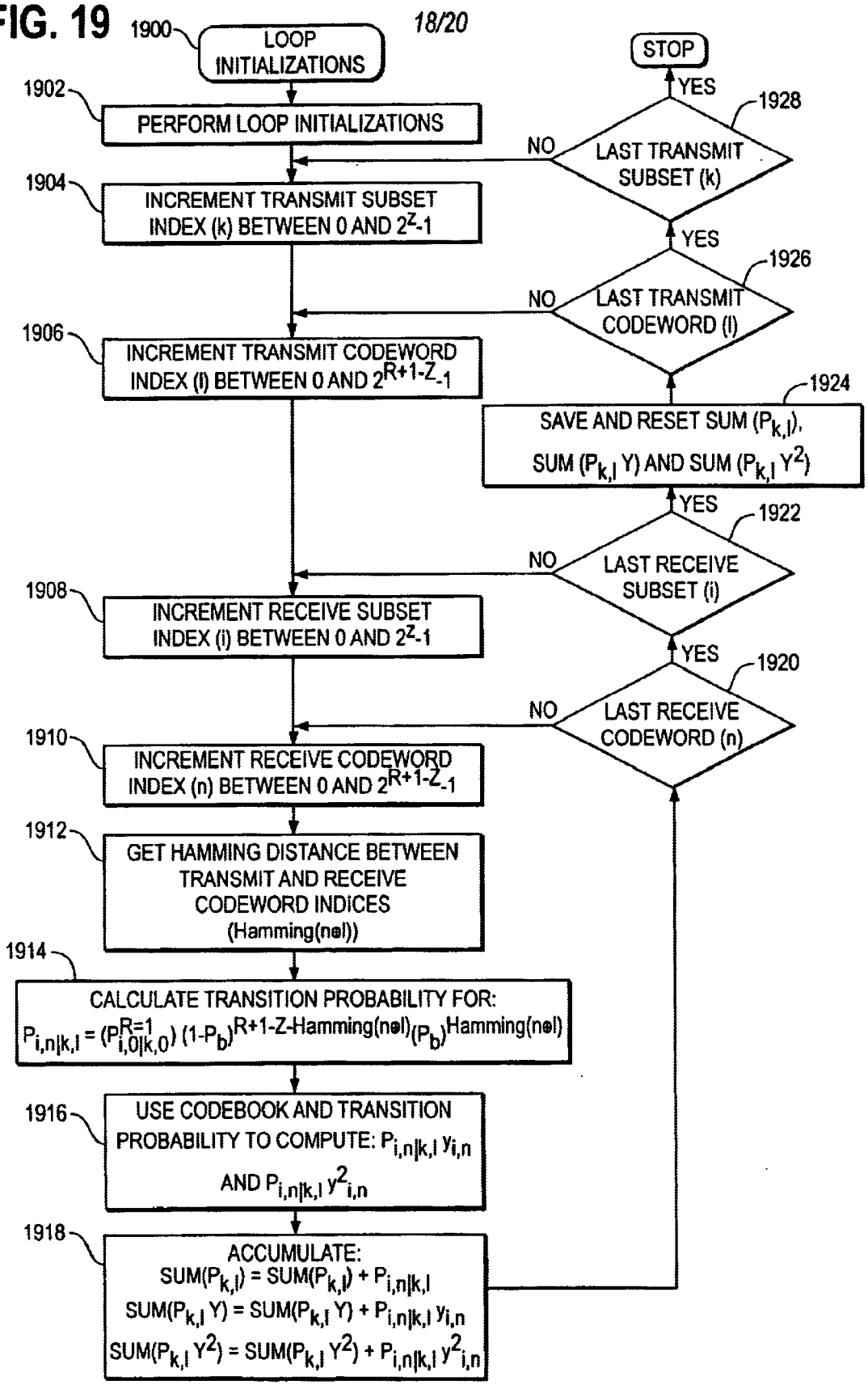
FIG. 19 is a flowchart illustrating a method of loop initialization as performed by one embodiment of the Viterbi encoding process of FIG. 14 according to a preferred exemplary embodiment of the present invention.
Figure 20:
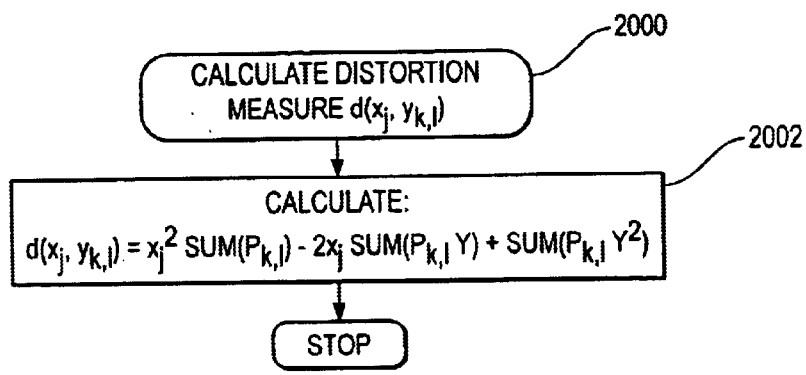
FIG. 20 is flowchart illustrating a method for determining the measure of distortion performed by the embodiment of the Viterbi encoding process of FIG. 14 according to a preferred exemplary embodiment of the present invention.

FIGS. 19 and 20 present methods, which lower the number of computations required for Viterbi encoding 1314 of FIG. 14. In particular, FIG. 19 shows an exemplary loop initialization 1900, and FIG. 20 shows an exemplary measure of distortion calculation 2000. In these alternate embodiments, the loop initialization 1900 is performed as the loop initialization 1402 of the Viterbi encoding 1314 (FIG. 14), and the calculation of the measure of distortion 2000 is performed for the transmittable codeword calculations 1410 (FIG. 14).

The Viterbi encoding 1314 of FIG. 14 generally uses equation (12) as previously discussed in this detailed description. The alternate embodiment of the Viterbi encoding 1314 generally implements an alternate form of equation (12) as follows:

$$d(x_j, y_{k,l}) = x_j^2 \sum_{i=0}^{N_1-1}\sum_{n=0}^{N_2-1} P_{i,n|k,l} - 2x_j \sum_{i=0}^{N_1-1}\sum_{n=0}^{N_2-1} P_{i,n|k,l} y_{i,n} + \sum_{i=0}^{N_1-1}\sum_{n=0}^{N_2-1} P_{i,n|k,l} y_{i,n}^2 \quad (17)$$

As should be apparent, the terms within the summations of equation (16) are not a function of input samples and can therefore be calculated outside of the programming loop that is repeated for each sample in the sample set 1214 (FIG. 12) processed during the Viterbi encoding 1314 (FIG. 14).

The loop initializations 1402 of the Viterbi encoding 1314 of FIG. 14 repeat $C^2$ calculations, where C is the number of codewords in the current codebook 1208 (FIG. 12). With respect to the loop initialization 1900 of FIG. 19, initializations are performed 1902 for this loop initialization 1900. Once the loop initializations are performed 1902, the transmit subset index (k) is incremented 1904, the transmit codeword index (l) is incremented 1906, the receive subset index (i) is incremented 1910 and the receive codeword index (n) is incremented as previously described with respect to these actions in FIG. 14. The transmit subset index (k) increment 1904, transmit codeword index (l) increment 1906, the receive subset index (i) increment 1908 and receive codeword index (n) increment 1910 also provide entry points for four nested loops, with the inner-most loop executed $C^2$ times after the receive codeword index (n) is incremented 1910 in the loop initialization 1900.

Following the receive codeword index (n) increment 1910, a hamming distance (Hamming(n⊕l)) is obtained 1912 between the transmit codeword index (l) and the receive codeword index (n). Next, a transition probability ($P_{i,n|k,l}$) is calculated for the combination of transmittable and receivable codewords 1504 (FIG. 15) for the transmit subset index(k), transmit codeword index (l), receive subset index (i) and receive codeword index (n) 1914. The transition probability ($P_{i,n|k,l}$) is calculated 1914 using equation (13). As previously discussed, for encoding bit rates greater than one (i.e., R>1), the transition probability ($P_{i,n|k,l}$) calculation is preferably used to modify the base channel transition probabilities to form channel transition probabilities suitable for the current encoding bit rate (R). In an alternate embodiment, obtaining the hamming distance 1912 and calculating the transition probability ($P_{i,n|k,l}$) 1914 may be replaced with a table look-up operation that utilizes tables containing pre-calculated values for channel transition probabilities ($P_{i,n|k,l}$).

After the transition probability is computed 1914, the current codebook 1208 (FIG. 12) and the channel transition probability ($P_{i,n|k,l}$) are use to calculate terms of equation (17) 1906. More specifically, the current codebook 1208 (FIG. 12) and the channel transition probability ($P_{i,n|k,l}$) are use to calculate the three terms of equation (17) (i.e., ($P_{i,n|k,l}$) ($y_{i,n}$) and ($P_{i,n|k,l}$) ($y_{i,n}$)$^2$). Following the calculation of these equation (17) terms 1906, cumulative totals (SUM($P_{k,l}$), SUM($P_{k,l}Y$), and SUM($P_{k,l}Y^2$)) are formed through accumulation of the channel transition probability ($P_{i,n|k,l}$) and the terms of equation (17) (i.e., ($P_{i,n|k,l}$) ($y_{i,n}$), and ($P_{i,n|k,l}$) ($y_{i,n}$)$^2$), respectively. Then, a determination is made as to whether the last receive codeword has been processed 1920, which routes the loop initialization 1900 to increment the receive codeword index (n) 1910 until the last codeword for the current receive subset and transmit codeword is encountered. When the last codeword for the current receive subset and transmit codeword is discovered, a determination is made as to whether the last receive subset has been processed 1922, which routes the loop initialization 1900 to increment the receive subset index (i) 1908 until the last receive subset for the current transmit codeword is detected. When the last receive subset is detected the cumulative totals (SUM($P_{k,l}$), SUM($P_{k,l}Y$), and SUM($P_{k,l}Y^2$)), have been accumulated over substantially all of the received codewords for the specified transmit codeword, and the cumulative totals (SUM($P_{k,l}$), SUM($P_{k,l}Y$), and SUM($P_{k,l}Y^2$)) are saved and the accumulators are reset 1924 so that cumulative totals can be accumulated for another transmit codeword.

Following the save and reset operation 1924, a query is made to determine whether the last transmit codeword has been encountered 1906 and the loop initialization 1900 is routed to increment the transmit codeword index (l) 1906 until the last codeword of the current transmit subset is found. When the last codeword of the current transmit subset is found, a determination is made as to whether the last transmit subset has been processed, and the loop initialization 1900 is routed to increment the transmit subset index (k) until the last transmit subset is detected in the last transmit subset (k) determination 1928. When the last transmit subset is encountered, the cumulative totals (SUM($P_{k,l}$), SUM($P_{k,l}Y$)), and SUM($P_{k,l}Y^2$) for substantially all possible transmittable codewords are saved, and the loop initialization 1900 is discontinued. Accordingly, each of the cumulative totals (SUM($P_{k,l}$), SUM($P_{k,l}Y$), and SUM($P_{k,l}Y^2$)) is accumulated over substantially all receivable codewords for each transmittable codeword. In other words, for each transmittable codeword, a receivable codeword set of calculations is performed to produce the cumulative totals. (SUM($P_{k,l}$), SUM($P_{k,l}Y$), and SUM($P_{k,l}Y^2$)). This receivable codeword set of calculations is performed once for each of the C transmittable codewords. However, once calculated, the receivable codeword set of calculations can be used for J samples in the sample set 1214 (FIG. 12) undergoing Viterbi encoding 1914 (FIG. 8).

In particular, by using the loop initialization of FIG. 19 as the loop initialization 1402 in the Viterbi encoding of FIG. 8, the calculations for the transmittable codeword set 1410 (FIG. 14) can be simplified, and the measure of distortion calculation 1400 of FIG. 14 may be performed in lieu of the transmittable codeword set of calculations 1410 illustrated in FIG. 14. Rather than lo performing C calculations for the measure of distortion ($d(x_j,y_{k,l})$) for each transmittable codeword ($y_{k,l}$), where C is the number of codewords in the current codebook 1208 (FIG. 12), a single calculation for the measure of distortion is performed as follows:

$$d(x_j, y_{k,l})=x_j^2 \text{SUM}(P_{k,l})-2x_j\text{SUM}(P_{k,l}Y)+\text{SUM}(P_{k,l}Y^2) \quad (18)$$

The Viterbi encoding of FIG. 14 performs a single calculation of the measure of distortion using equation (12) for each transmittable codeword ($y_{k,l}$). Accordingly, a reduction in computational complexity has been achieved for the Viterbi encoding 1314 (FIG. 14). The alternate embodiment of Viterbi encoding illustrated in FIGS. 19 and may accomplish the Viterbi encoding in the same amount of time using less power or more quickly using the same amount of power.

Figure 21:
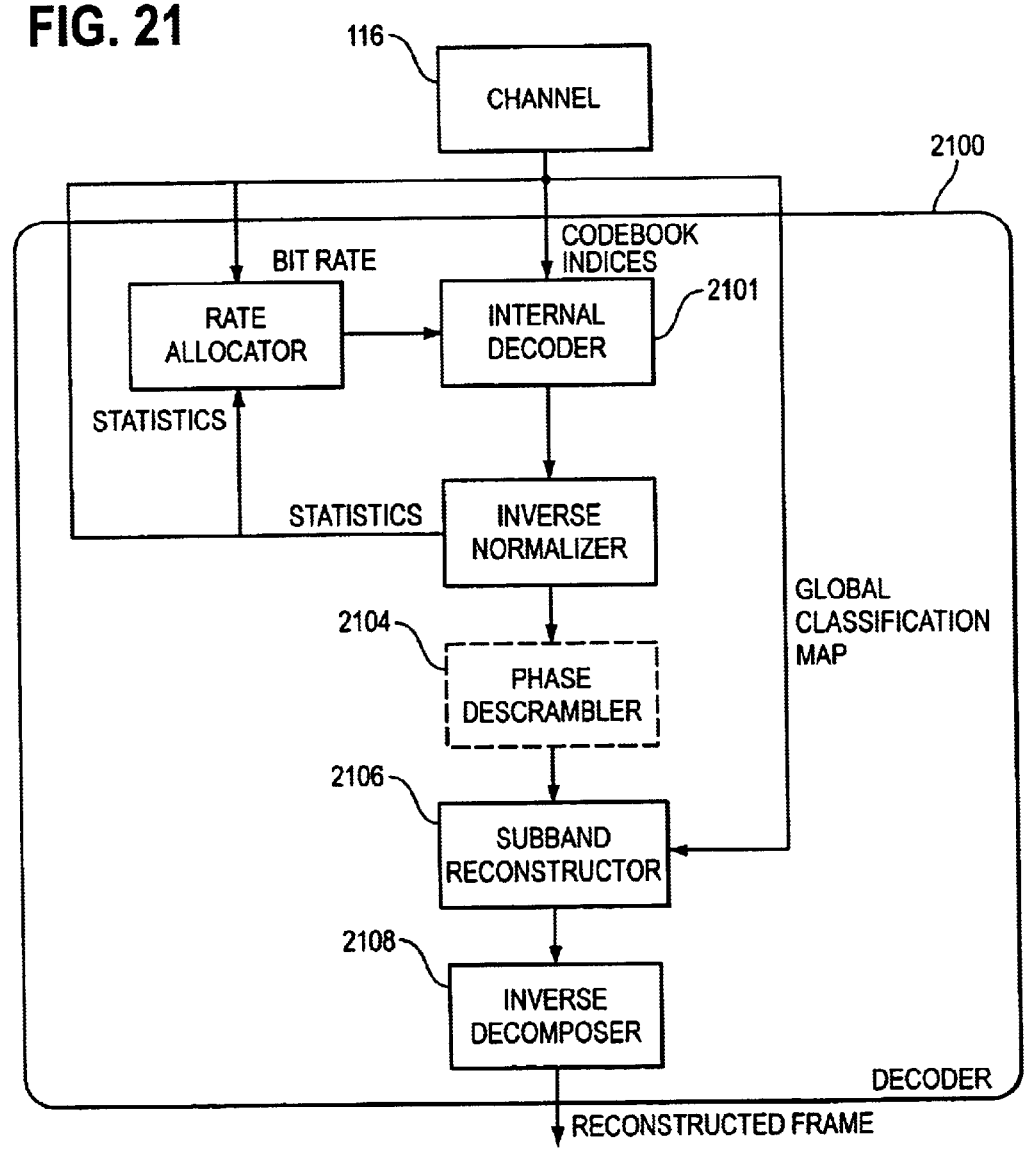
FIG. 21 is the decoder of FIG. 1 according to a preferred exemplary embodiment of the present invention.

Referring to FIG. 1, the receiver 114 of the communication system 110 receives the trellis-encoded data from channel 116. The receiver 114 decodes the trellis-coded data with a decoder 2100 (FIG. 21), which preferably contains an internal decoder 2101, which is preferably a COTCQ decoder. Referring to FIG. 21, the internal decoder 2101 uses substantially the same codebook table 1204 (FIG. 12) used by encoder 1200 (FIG. 12). In decoding the trellis-encoded data, the internal decoder 2101 generally follows the lowest cost path through the trellis and performs table look-up operations using the codebook 1208 (FIG. 12) for the specified encoding bit rate (R) and bit error probability ($P_b$). The table look-up operations provide codewords 1504 (FIG. 15), which supplied by the internal decoder 2101 to an optional phase descrambler 2104 and subband reconstructor 2106 to reflect the inverse operations performed by the encoder 118 (FIG. 1). These codewords are supplied to the subband reconstructor 2106 with side information, and the subband reconstructor 2106 forms a facsimile of the original subband-class sequences.

Figure 22:
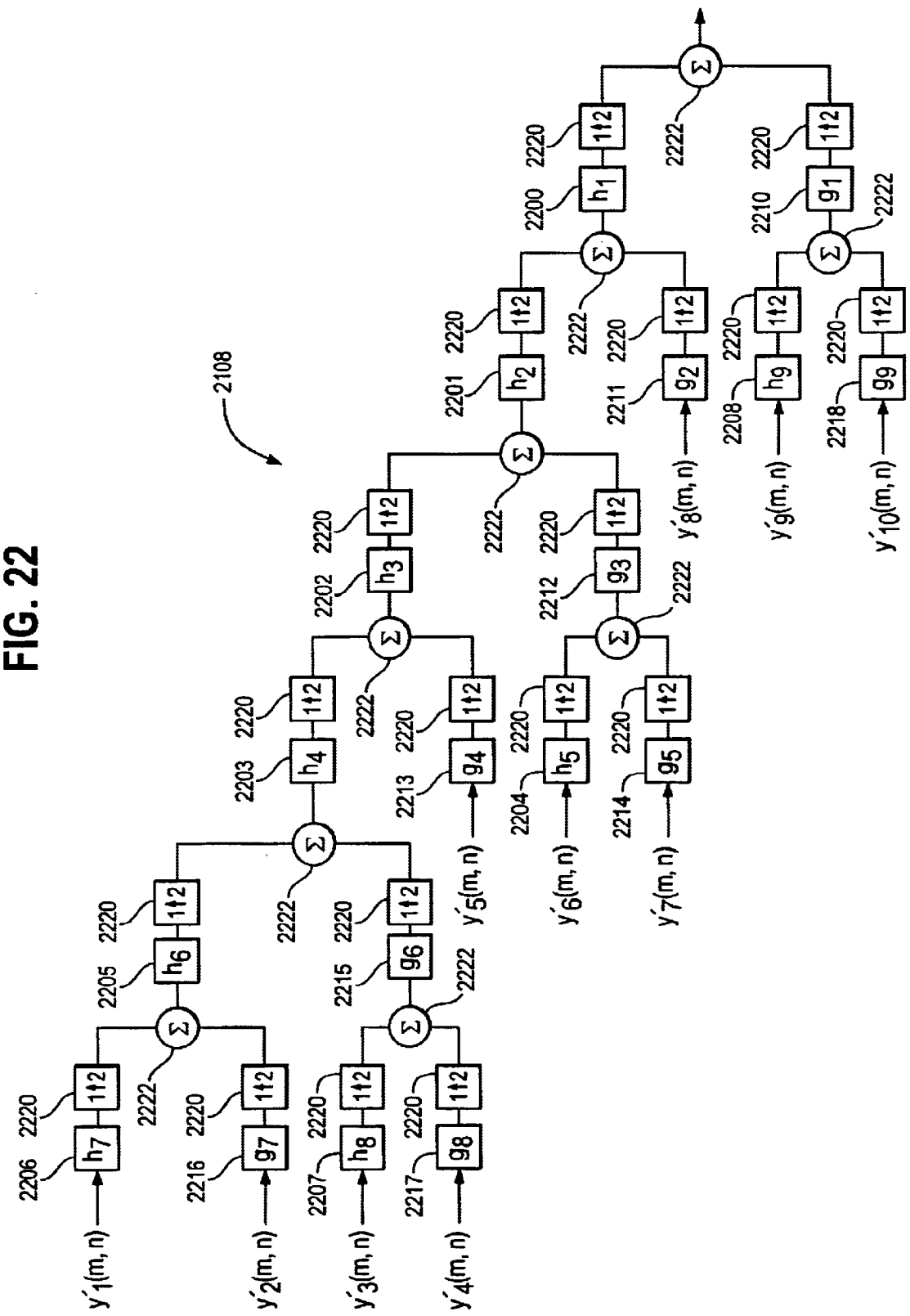
FIG. 22 is the inverse decomposer of FIG. 21 according to a preferred exemplary embodiment of the present invention.

More specifically, and with reference to FIG. 22, an example of an inverse operation of the decoder 2100 (FIG. 21) is illustrated in the form of the inverse decomposer 2108. The inverse decomposer 2108 is preferably configured to implement a DWT operation. The inverse decomposer 2108 includes a plurality of low pass filters 2200–2208, a plurality of high pass filters 2210–2218, a plurality of 1-to-2 up sampler 2220, and a plurality of summers 2222. Operation of the inverse decomposer 2108 is essentially the reverse of the operation of the decomposer 404 of FIG. 6. The impulse responses (i.e., $h_1$–$h_9$ and $g_1$–$g_9$) of the high-pass filters 2200–2208 and the low-pass filters 2210–2218 are related to the impulse responses for the corresponding filters in the inverse decomposer (i.e., $h_1'$–$h_9'$ and $g_1'$–$g_9'$) as previously described with reference to FIG. 6. The 1-to-2 up samplers 2220 add a bit of information (e.g., a zero) between each successive pair of data bits in an input data stream. This is to compensate (in the surge of frequency scale 18) for the removal of bits by the 2-to-1 down samplers 650 in the DWT decomposition unit 404 (FIG. 6). The summers 2222 are operative for adding the spectral subband components to one another to ultimately achieve a single signal.

From the foregoing description, it should be appreciated that the present invention provides methods and apparatus for video coding are provided that enable the transmission of high quality compressed video over noisy channels having limited-bandwidth, without substantial reliance upon channel coding, entropy coding, or motion compensation. Furthermore, it should be appreciated that a vast number of variations in the embodiments exist and these embodiments are preferred exemplary embodiments only, which are not intended to limit the scope, applicability, or configuration of the invention in any way. Rather, the foregoing detailed description is intended to provide those skilled in the art with a convenient road map for implementing a preferred exemplary embodiment of the invention. It being understood that various changes may be made in the function and arrangement of elements described in the exemplary preferred embodiment without departing from the spirit and scope of the invention as set forth in the appended claims.

what is claimed is:

1. A method of coding a input frame of a video sequence for transmission over a channel, comprising:

decomposing said input frame into a plurality of subbands;

dividing said plurality of subbands into a plurality of blocks corresponding to a region of said input frame;

selecting said plurality of blocks in a plurality of highest frequency subbands of said plurality of subbands based upon a luminance component of said input frame;

classifying said plurality of blocks in said plurality of highest frequency subbands into a plurality of classes to provide a plurality of class labels for said plurality of blocks in said plurality of highest frequency subbands;

collecting said plurality of class labels to form a subband classification map for each of said plurality of blocks in said plurality of highest frequency subbands;

constructing a global classification map from a majority evaluation of said subband classification map for each of said plurality of blocks in said plurality of highest frequency subbands; and grouping said plurality of blocks within said plurality of subbands having one of said plurality of class labels to form a plurality of subband class sequences.

2. The method of claim 1, wherein said decomposing said input frame into a plurality of subbands is a two-dimensional discrete wavelet transform (DWT).

3. The method of claim 1, further comprising encoding said plurality of subband class sequences.

4. The method of claim 3, wherein said encoding is channel-optimized trellis coded quantization (COTCQ) encoding.

5. The method of claim 1, further comprising phase scrambling said plurality of subband class sequences.

6. The method of claim 1, further comprising normalizing said plurality of subband class sequences.

7. A apparatus for coding a input frame of a video sequence for transmission over a channel, comprising:

a decomposer configured to receive said input frame and decompose said input frame into a plurality of subbands that are divided into a plurality of blocks corresponding to a region of said input frame; and a classifier configured to receive said plurality of subbands that are divided into said plurality of blocks corresponding to said region of said input frame, said classifier also configured to:

select said plurality of blocks in a plurality of highest frequency subbands of said plurality of subbands based upon a luminance component of said input frame;

classify said plurality of blocks in said plurality of highest frequency subbands into a plurality of classes to provide a plurality of class labels for said plurality of blocks in said plurality of highest frequency subbands;

collect said plurality of class labels to form a subband classification map for each of said plurality of blocks in said plurality of highest frequency subbands;

construct a global classification map from a majority evaluation of said subband classification map for each of said plurality of blocks in said plurality of highest frequency subbands; and grouping said plurality of blocks within said plurality of subbands having one of said plurality of class labels to form a plurality of subband class sequences.

8. The apparatus of claim 7, wherein said decomposer is configured to decompose said frame into a plurality of subbands with a two-dimensional discrete wavelet transform (DWT).

9. The apparatus of claim 7, further comprising an encoder configured to encode said plurality of subband class sequences.

10. The apparatus of claim 9, wherein said encoder is configured to perform channel-optimized trellis coded quantization (COTCQ) encoding.

11. The apparatus of claim 7, further comprising a phase scrambler configured to phase scramble said plurality of subband class sequences.

12. The apparatus of claim 7, further comprising a normalizer configured to normalize said plurality of subband class sequences.

13. A method for coding a video sequence for transmission over a channel, comprising:

receiving the video sequence, the video sequence having a plurality of frames;

grouping said plurality of frames into a group of pictures;

coding an initial frame of said group of pictures to produce a coded initial frame;

transmitting said coded initial frame over the channel;

decoding said coded initial frame to produce a decoded initial frame;

constructing a first error frame estimate with said decoded initial frame;

obtaining a first error frame of a first frame from said first error frame estimate and said first frame;

coding said first error frame to produce a first coded error frame, said coding said first error frame comprising:

decomposing said first error frame into a plurality of subbands;

dividing said plurality of subbands into a plurality of blocks corresponding to a region of said first error frame;

selecting said plurality of blocks in a plurality of highest frequency subbands of said plurality of subbands based upon a luminance component of said first error frame;

classifying said plurality of blocks in said plurality of highest frequency subbands into a plurality of classes to provide a plurality of class labels for said plurality of blocks in said plurality of highest frequency subbands;

collecting said plurality of class labels to form a subband classification map for each of said plurality of blocks in said plurality of highest frequency subbands;

constructing a global classification map from a majority evaluation of said subband classification map for each of said plurality of blocks in said plurality of highest frequency subbands;

grouping said plurality of blocks within said plurality of subbands having one of said plurality of class labels to form a plurality of subband class sequences; and encoding said plurality of subband class sequences to form said first coded error frame; and transmitting said first coded error frame over the channel.

14. The method of claim 13, further comprising:

decoding said first coded error frame to produce a decoded first error frame;

constructing a second error frame estimate with said decoded first error frame;

obtaining a second error frame of a second frame from said second error frame estimate and said second frame;

coding said second error frame to produce a second coded error frame; and transmitting said second coded error frame over the channel.

15. The method of claim 14, wherein coding said second error frame to produce a second coded error frame comprises:

decomposing said second error frame into a second plurality of subbands;

dividing said second plurality of subbands into a second plurality of blocks corresponding to a second region of said second error frame;

selecting said second plurality of blocks in a second plurality of highest frequency subbands of said second plurality of subbands based upon a second luminance component of said second error frame;

classifying said second plurality of blocks in said second plurality of highest frequency subbands into a second plurality of classes to provide a second plurality of class labels for said second plurality of blocks in said second plurality of highest frequency subbands;

collecting said second plurality of class labels to form a second subband classification map for each of said second plurality of blocks in said second plurality of highest frequency subbands;

constructing a second global class map from a second majority evaluation of said second subband classification map for each of said second plurality of blocks in said second plurality of highest frequency subbands;

grouping said second plurality of blocks within said second plurality of subbands having one of said second plurality of class labels to form a second plurality of subband class sequences; and encoding said second plurality of subband class sequences to form said second coded error frame.

16. The method of claim 13, wherein said decomposing said first error frame into a plurality of subbands is a two-dimensional discrete wavelet transform (DWT).

17. The method of claim 13, further comprising encoding said plurality of subband class sequences.

18. The method of claim 17, wherein said encoding is channel-optimized trellis coded quantization (COTCQ) encoding.

19. The method of claim 13, further comprising phase scrambling said plurality of subband class sequences.

20. The method of claim 13, further comprising normalizing said plurality of subband class sequences.

* * * * *

UNITED STATES PATENT AND TRADEMARK OFFICE
CERTIFICATE OF CORRECTION

PATENT NO.  : 6,661,842 B1
DATED       : December 9, 2003
INVENTOR(S) : Glen Patrick Abousleman It is certified that error appears in the above-identified patent and that said Letters Patent is hereby corrected as shown below:

Column 7,
Line 54, delete "$N'_{j+1}$'" and insert -- $N'_{j+1}$ --
Line 54, delete "$N'_j+N'_{j+}=N_j+N_{j+1}$" and insert -- $N'_j+N'_{j+1}=N_j+N_{j+1}$ --
Line 60, delete "$N'_j+N'+1=N_j+N_{j+1}$" and insert -- $N'_j+N'_{j+1}=N_j+N_{j+1}$ --
Line 65, delete "new vector (N)" and insert -- new vector ($\underline{N}$) --

Column 16,
Line 37, delete "$P_{i,n/k,l}=P_{i,0/k,0}{}^{R=1}(1-P_b)^{R+1-Z-\text{Hamming}(1/\oplus n)} P_b{}^{\text{Hamming}(1\oplus n)}$" and insert -- $P_{i,n/k,l}=P_{i,0/k,0}{}^{R=1}(1-P_b)^{R+1-Z-\text{Hamming}(1\oplus n)} P_b{}^{\text{Hamming}(1\oplus n)}$ --.

Column 18,
Line 19, insert -- . -- before "So"

Column 21,
Line 4, delete "o"

Column 23,
Line 9, delete "lo"
Line 21, insert -- 20 -- after "19 and"

Signed and Sealed this

Twenty-third Day of March, 2004

JON W. DUDAS
*Acting Director of the United States Patent and Trademark Office*